United States Patent
Monga

(10) Patent No.: US 8,044,684 B1
(45) Date of Patent: Oct. 25, 2011

(54) INPUT AND OUTPUT BUFFER INCLUDING A DYNAMIC DRIVER REFERENCE GENERATOR

(75) Inventor: Sushrant Monga, Greater Noida (IN)

(73) Assignee: STMicroelectronics PVT. Ltd., Greater Noida (UP) (IN)

( * ) Notice: Subject to any disclaimer, the term of this patent is extended or adjusted under 35 U.S.C. 154(b) by 0 days.

(21) Appl. No.: 12/840,934

(22) Filed: Jul. 21, 2010

(30) Foreign Application Priority Data

Apr. 15, 2010 (IN) .............................. 903/DEL/2010

(51) Int. Cl.
H03K 19/0175 (2006.01)
(52) U.S. Cl. ............................. 326/81; 326/86; 326/87
(58) Field of Classification Search ............. 326/56–58, 326/62–63, 68, 80–83, 86–87; 327/333
See application file for complete search history.

(56) References Cited

U.S. PATENT DOCUMENTS

| | | |
|---|---|---|
| 5,378,945 A | 1/1995 | Partovi et al. |
| 5,418,476 A | 5/1995 | Strauss |
| 5,432,467 A | 7/1995 | Reddy |
| 5,670,898 A | 9/1997 | Fang |
| 5,892,377 A | 4/1999 | Johnston et al. |
| 5,952,847 A | 9/1999 | Plants et al. |
| 5,952,848 A | 9/1999 | Morris |
| 6,084,431 A | 7/2000 | Shigehara et al. |
| 6,208,167 B1 * | 3/2001 | Ranjan et al. ................... 326/81 |
| 6,313,661 B1 | 11/2001 | Hsu |
| 6,333,663 B1 | 12/2001 | Lee |
| 6,977,523 B2 | 12/2005 | Tamaki |
| 7,164,308 B2 | 1/2007 | Lee |
| 2002/0186058 A1 * | 12/2002 | Prodanov ...................... 327/108 |
| 2005/0285657 A1 * | 12/2005 | Watt ............................. 327/313 |
| 2007/0210838 A1 | 9/2007 | Gupta et al. |
| 2007/0247209 A1 * | 10/2007 | Chen ............................ 327/333 |
| 2009/0108870 A1 * | 4/2009 | Wang et al. .................... 326/68 |
| 2009/0167413 A1 * | 7/2009 | Im et al. ....................... 327/512 |

OTHER PUBLICATIONS

Chen, S. and Ker, M., "A New Schmitt Trigger Circuit in a 0.13-um 1/2.5-V CMOS Process to Receive 3.3-V Input Signals", IEEE Transactions on Circuits and Systems-II: Express Briefs, vol. 52, No. 7, Jul. 2005, pp. 361-365.

* cited by examiner

*Primary Examiner* — Shawki Ismail
*Assistant Examiner* — Jany Tran
(74) *Attorney, Agent, or Firm* — William J. Kubida; Peter J. Meza; Hogan Lovells US LLP

(57) ABSTRACT

A system having an input and output buffer includes a dynamic driver reference generator to generate dynamic driver reference signals based on a data signal and an IO buffer supply voltage, a level shifter to generate level shifted signals based, in part, on the dynamic driver reference signals, and a driver having at least one stress transistor. The driver dynamically adjusts a voltage across the stress transistor based on at least one of dynamic driver reference signals, the level shifted signals, and a current state of an IO pad.

33 Claims, 16 Drawing Sheets

INPUT AND OUTPUT BUFFER INCLUDING A DYNAMIC DRIVER REFERENCE GENERATOR

RELATED APPLICATION

The present application claims priority of Indian Patent Application No. 903/DEL/2010 filed Apr. 15, 2010, which is incorporated herein in its entirety by this reference.

TECHNICAL FIELD

The present subject matter relates to, in general, buffers, and in particular, relates to input and output buffers.

BACKGROUND

With the recent advancements in integrated circuit (IC) technology, ICs are becoming increasingly complex on one hand and more compact on the other. With the reduction in size of transistors on the ICs, a level of power supply supplied to the ICs is also reducing. As a result, the IC standards have shifted focus from 5 Volts (V) power supply to lower voltages, such as 3.3 V and 1.8 V. The low voltages of power supply offer various advantages, namely, lower power consumption and reduced capacitance in between lines.

However, new system components, based on the new standards of lower power supply, should be backward compatible with the existing system components operating on 5V power supply. For this, various schemes offer mixed voltage integrated circuits, in which a circuit operating at a low voltage can communicate with a circuit operating at a high voltage. For example, input and output (IO) buffers are implemented to facilitate communication between the components working on different voltage standards.

The IO buffers include level shifters and drivers, which interface with different components having different operating voltages. Generally, the level shifters and drivers use thick oxide transistors, which can tolerate up to 5V. However, the usage of thick oxide transistors is associated with two main problems. First, the thick oxide transistors cover substantial PCB real estate and second, more number of processing steps are needed to fabricate an IO buffer.

Also, while the level shifter and driver stages have thick oxide transistors, other stages of the IO buffer may be fabricated from thin oxide transistors. Using different kinds of transistors further increases the number of processing steps and hence, adds to the overall cost of the IC.

Thus, certain schemes have been devised to implement the complete circuitry with the thin oxide transistors alone. However, the thin oxide transistors may not be able to support high voltage overdrives. Thus, some schemes either suggest the use of parallel architectures or a level shifter, which has transistors in cascode circuit arrangements to limit voltage stress on the driver. In such circuit arrangements, a problem arises if a cascode transistor is faulty because a switching transistor will be subjected to whatever voltage stress the cascode device was designed to limit, thus damaging the switching transistor and the IC permanently. Such structural failures may be detrimental to the system in which the IC is implemented.

In addition, such a cascode circuit arrangement of thin oxide transistors operates on the basis of an externally generated reference, which is distributed on the reference rails to the I/O buffer chain, which limits the speed of operation of the integrated circuit to 5 MHz as transistor is stressed between any two terminals during the transients. The problem of stress on the switching transistors increases at increasing speeds. Some schemes have suggested the use of a triple cascode circuit arrangement to reduce the level of stress. However, implementations of such schemes occupy a significant amount of extra silicon area.

SUMMARY

This summary is provided to introduce concepts related to an input and output (IO) buffer. This summary is not intended to identify essential features of the claimed subject matter nor is it intended for use in determining or limiting the scope of the claimed subject matter.

In one implementation, the system includes a dynamic driver reference generator to generate a plurality of dynamic driver reference signals based on a data signal and an IO buffer supply voltage; a level shifter to generate a plurality of level shifted signals based, in part, on the dynamic driver reference signals; and a driver having at least one stress transistor. The driver is configured to dynamically adjust a voltage across the stress transistor based on at least one of the dynamic driver reference signals, the level shifted signals, and a current state of an IO pad.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION OF PREFERRED EMBODIMENTS

Figure 1A:
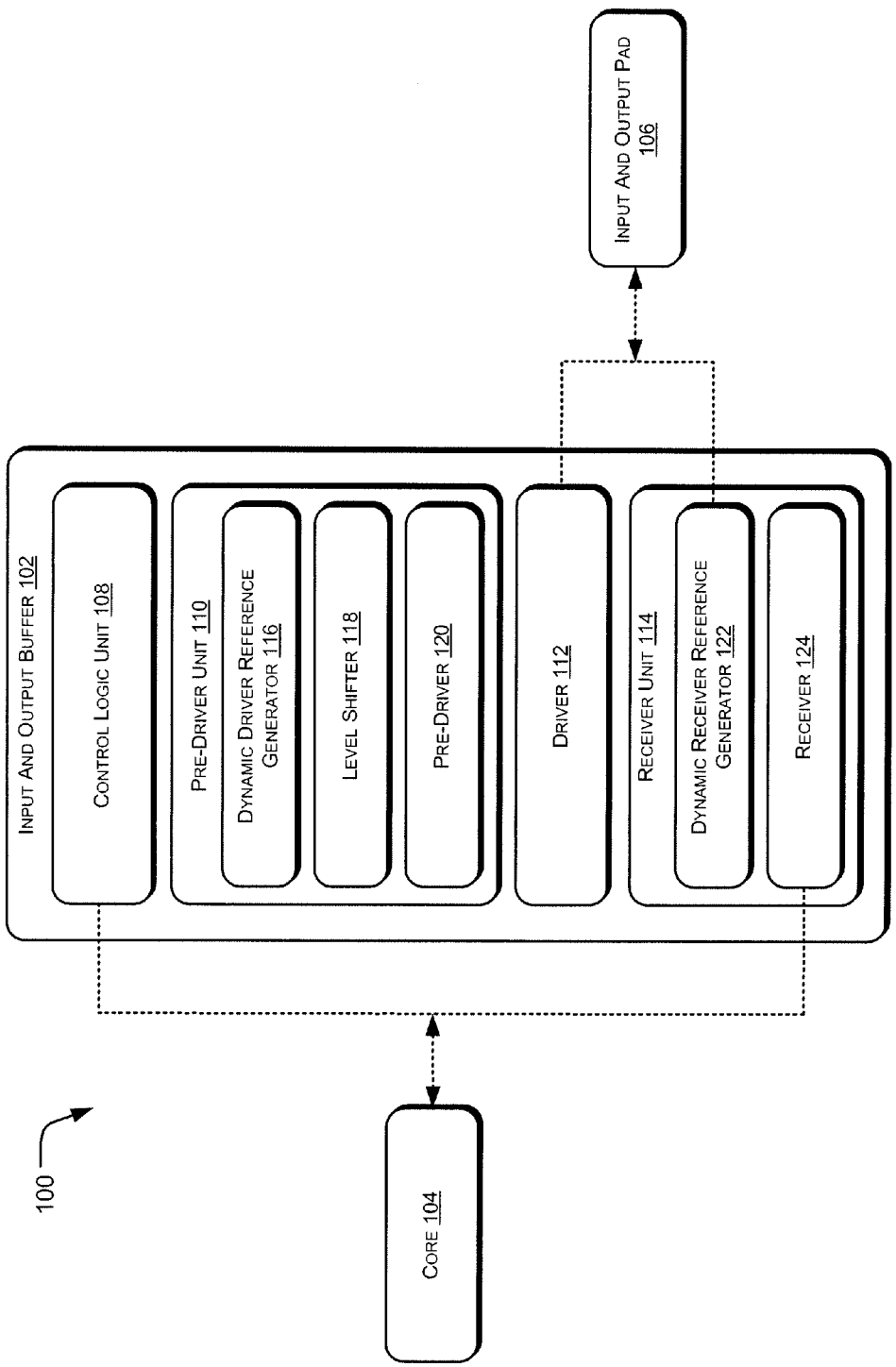
FIG. 1(a) illustrates block diagram of an exemplary system embodying an input and output (IO) buffer, in accordance with an embodiment of the present subject matter.

The disclosed subject matter relates to an input and output (IO) buffer. Particularly, the subject matter relates to a high speed, stress free IO buffer.

With the advent of sub-micron technology, IC dimensions are decreasing to make the ICs suitable for low power and low cost applications. These ICs operate at various voltage levels to drive devices operating on different voltage standards. For example, the core operates at a low voltage, say in the order of 1 volt, while the IO pads are connected to high load impedances, say in the order of 100 picofarads.

In order to facilitate communication between the core and the IO pads, IO buffers are implemented, each of which includes a logic unit, level shifters, and drivers. One notable problem in interfacing a low-voltage circuitry, such as the core, with a high voltage circuitry, such as the IO pads, is that if the voltage applied to the low voltage circuitry increases beyond a threshold value, some devices may experience temporary or even permanent damage. At the process level, transistors in the IO buffers can be fabricated to endure high voltage stresses by increasing gate oxide thickness. This, however, increases the fabrication cost because of the increase in the number of processing steps. Another disadvantage is performance degradation. The high speed, stress free IO buffer embodiments described herein will help address the aforementioned issues in addition to providing several other advantages over the existing IO buffers.

The IO buffer of the present subject matter includes a control logic unit, pre-driver unit, a driver, and a receiver unit. The pre-driver unit further includes a dynamic driver reference generator, a level shifter, and a pre-driver, while the receiver unit includes a dynamic receiver reference generator and a receiver. Further, the IO buffer is directly connected in between the core and the IO pad.

The core generates control signals based on which a mode, in which the IO buffer is to be operated, is selected. For example, based on the control signal, the IO buffer may work in a transmit mode or a receive mode. To send data from the core to the IO pad, data signals from the core are skewed and level shifted to generate a pair of conditioned data signals.

Instead of multiple external reference rails for p-channel and n-channel transistors, as in the case of conventional IO buffers, the IO buffer of the present subject matter includes the dynamic driver reference generator and the dynamic receiver reference generator. The dynamic driver reference generator provides two pairs of complementary and differential reference signals, also referred to as dynamic driver reference signals, based, at least, on the conditioned data signals, such that each pair is at a different common mode level (CM1, CM2). The level shifter, the pre-driver unit, the receiver unit, and the driver operate on the basis of the dynamic driver reference signals, which change in phase with the conditioned data signals. The use of the dynamic driver reference signals adds robustness in terms of speed and overstress voltage.

In operation, the level shifter receives the dynamic driver reference signals and provides two pairs of level shifted signals at two different common mode levels (CM3, CM4). The pre-driver receives the level shifted signals to provide two pairs of complementary pre-driver signals at two different common mode levels (CM3, CM4). The pre-driver is configured to boost gain of the level shifted signals.

Further, the pre-driver signals, the level shifted signals, and a skewed version of the pre-driver signals are fed to the driver. The driver is a staggered device, which uses inputs from the level shifter and the driver in a pre-defined ratio. The driver identifies a control signal for transition in the IO pad and, accordingly, modifies a bias provided to a gate terminal of a stress transistor so that charging and discharging of the stress transistor can be controlled during the transients when the pad signal is switching between states. The bias provided to the stress transistor varies dynamically with variations in the conditioned data signals, the IO buffer voltage supply and the current state of the IO pad. This is particularly helpful in case the conditioned data signals have transients.

While aspects of the described IO buffer can be implemented in any number of different systems, circuitries, environments, and/or configurations, the embodiments are described in the context of the following exemplary system(s) and circuit(s). Additionally, the word "connected" is used throughout for clarity of the description and can include either a direct connection or an indirect connection. The descriptions and details of well-known components are omitted for simplicity of the description.

Although the devices are explained herein as certain N-channel and P-channel devices, it can be appreciated that complementary devices are also possible in accordance with the present subject matter. Accordingly, the logic level of control signals can either be active low or active high. It will be appreciated by those skilled in the art that the words during, while, and when as used herein are not exact terms that mean an action takes place instantly upon an initiating action but that there may be some small but reasonable delay, such as a propagation delay, between the initial action and the reaction that is initiated by the initial action. Also, the signals may be referenced by the node at which the signals are obtained.

Figure 1B:
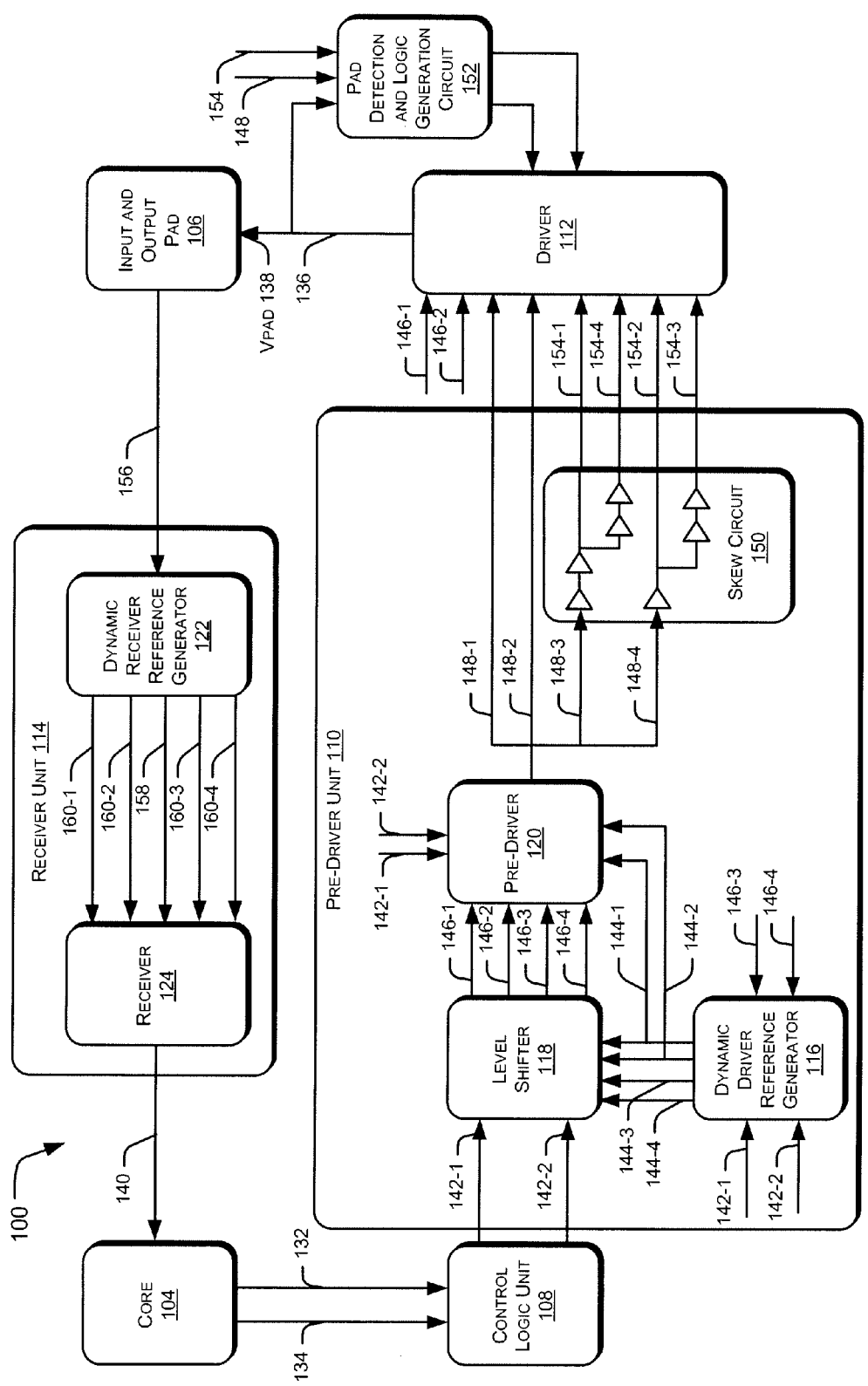
FIG. 1(b) illustrates block diagram of an exemplary system embodying an input and output (IO) buffer along with signal flow, in accordance with an embodiment of the present subject matter.

FIG. 1(a) illustrates a simplified block diagram of an exemplary system 100 embodying an input and output (IO) buffer 102 and FIG. 1(b) illustrates the exemplary system 100 along with the signal flow. In one embodiment, the system 100 is an integrated circuit (IC).

The system 100 includes a core 104, the IO buffer 102, and at least one IO pad 106. The core 104 includes circuits to perform various functions and interacts with peripheral circuits through the IO pad 106. Generally, the core 104 operates at a level of core voltage supply ($V_{CORE}$) that is lower than that of an JO voltage of the IO pad 106. For example, the core 104 operates at a low voltage, say at about 1 V, while the IO pad 106 drives a load impedance, for example, having value of about 100 picofarads (pF). In one implementation, the system 100 described herein can operate at a $V_{CORE}$ as low as 0.65V.

Due to the differences in standards between the core 104 and the peripheral circuits, the IO buffer 102 acts as an interface between the core 104 and the IO pad 106 to facilitate communication. The IO buffer 102 includes transistors having large current driving capacity, which can drive load capacitance through the IO pad 106 to a requisite voltage level (i.e., high or low) for conveying a correct logic value (i.e., logic '1' or logic '0') of an output signal from the core 104.

Further, in one example, the IO buffer 102 is a bidirectional IO buffer, which allows bidirectional transfer of data between the core 104 and the IO pad 106, that is the direction of transfer (input or output) depends on whether a user selects an input operation or output operation. For this, the core 104 is configured to select a mode in which the IO buffer 102 is to be operated. For example, the IO buffer 102 works either in a transmit mode or a receive mode based on signals received from the core 104. In one implementation, the core 104 is also configured to operate the IO buffer 102 in a particular voltage range, for example, about 1.6V to about 2V in one range of operation and from about 2.6V to about 3.6V in another range of operation.

To render communication between the core 104 and the IO pad 106, the IO buffer 102 includes a control logic unit 108, a pre-driver unit 110, a driver 112, and a receiver unit 114. The pre-driver unit 110 includes a dynamic driver reference generator 116, a level shifter 118, and a pre-driver 120. The receiver unit 114 includes a dynamic receiver reference generator 122 and a receiver 124. The construction, exemplary embodiments, and operation of each of the units included in the IO buffer 102 are explained in detail in subsequent figures; however, an overall overview of the operation of the system 100 is elaborated in the following paragraphs.

Referring to FIG. 1(b), the core 104 generates a data signal 132 and a control signal bus 134. The control signal bus 134, which includes multiple control signals, is typically used to select a mode in which the system 100 is to be operated and a voltage range of operation. The modes of operation include transmit mode, receive mode, low power consumption mode or sleep mode, low power supply mode, high power supply mode, zero current consumption (IDDQ) mode.

For example, when the control signal bus 134 is high, the IO buffer 102 is in the transmit mode. In the transmit mode, the IO buffer 102 translates the data signal 132 received from the core 104 to a corresponding pad signal 136 for the IO pad 106. The pad signal 136, having a pad voltage $V_{PAD}$ 138, is capable of driving an off-chip load or a peripheral circuit. In an example, the $V_{PAD}$ 138 is at 3.3 V.

On the other hand, when the control signal bus 134 is low, the receive mode is triggered and an IO signal 156 is converted into a core signal 140. Similarly, other modes of operation may be triggered using the control signal bus 134, as will be understood by a person skilled in the art. In one example, the user may make a request to the core 104 for operating the system 100 in a particular mode, and the core 104, in turn, may generate the control signal bus 134 in conformance with the user request.

TRANSMIT MODE: In one embodiment, the core 104 is tied to the control logic unit 108 and provides the control signal bus 134 and the data signal 132 to the control logic unit 108. In one example, the data signal 132 and the control signal bus 134 are at about 0.9V. In case the transmit mode is selected, the control logic unit 108 converts the data signal 132 into conditioned data signals, namely cdata 142-1 and cdata* 142-2, collectively referred to as conditioned data signals 142.

The control logic unit 108 includes a signal conditioning block (not shown in the figure). In one implementation, the signal conditioning block adjusts slew of the data signal 132 by controlling the switching of the data signal 132. Additionally, the signal conditioning block shifts a level of the data signal 132. For example, the level of the data signal 132 is kept toward an intermediate voltage such as half of the IO buffer supply voltage. This helps in making the system 100 to operate at 0.65V core voltage.

As an illustration, consider a data signal 132 from the core 104 in the range of 0 to 700 millivolts (mV) and switching in picoseconds. Such fast switching with very high data slew rates may introduce an additional stress in one or more transistors in the level shifter 118 and subsequently in the other stages of the IO buffer 102. Therefore, the data signal 132 is first slew controlled by tuning the current capability of the transistor stages used in the control logic unit 108. In other words, slew control includes tuning the switching in picoseconds to switching in nanoseconds and level shifting from a range of 0 to 700 mV to a range of 0 to about 1800 mV. This helps in achieving high speeds in the order of 200 MHz.

Thus, the signal conditioning block transforms the data signal 132 into a set of complimentary rail-rail differential signals, which are also level shifted between a ground voltage and a reference voltage $V_{MID}$, while the data signal 132 switches at the $V_{CORE}$. In one implementation, the $V_{MID}$ is a factor, say 0.5, of an IO buffer supply voltage $V_{HIGH}$.

The slew controlled and level shifted data signal (not shown in the figure) is then processed to generate the conditioned data signals cdata 142-1 and cdata* 142-2 with minimum skew between each other. The conditioned data signals cdata* 142-2 is 180° out of phase with the cdata 142-1.

In one embodiment, the dynamic driver reference generator 116 uses the rail-to-rail complimentary set of conditioned data signals 142 and generates two sets of complimentary dynamic driver reference signals, namely MIDML 144-1 and MIDMR 144-2, and MIDPL 144-3 and MIDPR 144-4, collectively referred to as dynamic driver reference signals 144. The MIDML 144-1 and the MIDMR 144-2 (complement of MIDML 144-1) are at a common mode level CM1, and the MIDPL 144-3 and the MIDPR 144-4 (complement of MIDPL 144-3) are at a common mode level CM2.

Unlike the conditioned data signals 142, the dynamic driver reference signals 144 are not rail-to-rail and their swing can be calculated based on an architecture of the IO buffer 102 and voltage-temperature (VT) conditions. The dynamic driver reference signals 144 signals thus generated are process, voltage-temperature dependent and are synchronized with the conditioned data signals 142, thus providing robust control for a stable operation at a particular condition of the IO buffer 102. This is achieved through a low consumption, high speed level shifter 118, which does not utilize the VT shift for the particular n-channel and p-channel transistors.

In other words, the dynamic driver reference signals 144 are generated depending on a current state of the level shifter 118 and the conditioned data signals 142. Thus, during the transient simulations, the parameters of the dynamic driver reference signals 144, i.e., a common mode level, swing at the output, voltage slew, and the phase of the transitions with respect to the conditioned data signals 142 are automatically adjusted in accordance with the IO buffer supply voltage $V_{HIGH}$ and the particular PVT condition. This helps is providing robustness of operation with respect to the stress at higher speeds of operation.

Thus, the dynamic driver reference signals 144 are a function of the conditioned data signals 142, the IO buffer supply voltage $V_{HIGH}$, and the current state of the level shifter 118 or the pre-driver 120, as the case may be. As a result, the voltage level of the bias nodes is changed to support the change of voltages on the other nodes in phase with the data signals.

In said embodiment, the level shifter 118 receives the conditioned data signals 142 from the control logic unit 108 and generates a complementary pair of level shifted signals NL 146-3 and NR 146-4, which change their state in phase with the conditioned data signals 142. Based on the level shifted signals NL 146-3 and NR 146-4, the dynamic driver reference generator 116 generates dynamic driver reference signals 144 and feeds them back to the level shifter 118.

In another embodiment, the dynamic driver reference generator 116 directly derives the dynamic driver reference signals 144 independently of the level shifter 118. In this case, the conditioned data signals 142 are used as a direct input to both the dynamic driver reference generator 116 and the level shifter 118, thereby deriving the dynamic driver reference signals 144 in synchronism with the transitions in the conditioned data signals 142. As the dynamic driver reference generator 116 is faster than the level shifter 118 in terms of the delay of propagation of signals from input to output, the overall speed of operation of the system 100 is enhanced.

The level shifter 118 generates another pair of complementary level shifted signals, namely PL 146-1 and PR 146-2. The PL 146-1 and the PR 146-2 are complementary to each other and are at a common mode level CM3, while the NL 146-3 and the NR 146-4 are complementary to each other and are at a common mode level CM4.

All the level shifted signals are collectively referred to as level shifted signals 146. It should be noted that while the PL 146-1 and the PR 146-2 are complimentary set of signals used for driving the p-channel transistors in the consecutive cascaded stages, the NL 146-3 and the NR 146-4 are another set of complimentary signals used for driving the n-channel transistors in other cascaded stages.

In one embodiment, the level shifter 118 is configured in such a way that it can switch between any two voltage levels without using multiple external reference rails as used in conventional schemes. The level shifter 118 derives dynamic drives and voltage phases from the dynamic driver reference signals 144. In addition, since the dynamic driver reference signals 144 are in synchronism with the conditioned data signals 142, the use of multiple external reference rails is avoided and robustness, in speed and overstress voltage, is achieved in terms of the operation at a particular voltage-temperature (VT) condition. Since the dynamic driver reference signals 144 are variable, the transistors in the level shifter 118 can work faster than those in the conventional designs as the transistors are now being controlled dynamically by variations (both DC and AC) in the conditioned data signals 142.

Subsequently, the level shifted signals 146 are fed to the pre-driver 120. The pre-driver 120 is configured to boost the gain of each of the level shifted signals 146 and control rise and fall times of the pad signal 136 at the driver 112.

In one embodiment, the pre-driver 120 also receives the MIDML 144-1 and the MIDMR 144-2 from the dynamic driver reference generator 116. In another embodiment, the pre-driver 120 may receive all four dynamic driver reference signals 144. The predriver 120 also operates on the same design principles as the level-shifter 118 and thus enhances the slew and the drive of the level shifted signals 146.

Similar to the level shifter 118, the pre-driver 120 also generates two pairs of complementary and differential pre-driver signals, namely PLL 148-1 and PRR 148-2, and NLL 148-3 and NRR 148-4, collectively referred to as differential pre-driver signals 148. Similar to the level shifted signals 146, the pre-driver signals 148 are also at two different common mode levels (CM3 and CM4). Since, the level shifter 118 and the pre-driver 120 both derive bias dynamically from the dynamic driver reference generator 116 in a complementary fashion, the system 100 can run at speeds up to 200 MHz. The pre-driver signals 148 are fed to the driver 112.

In one embodiment, the driver 112 is tied to the level shifter 118, the pre-driver 120, a skew circuit 150, the IO pad 106, and a pad detection and logic generation circuit 152. The skew circuit 150 includes several inverter stages to skew a pair of complementary and differential pre-driver signals, for example, the NLL 148-3 and the NRR 148-4, by adding different loads to the inverter stages. As a result, four skewed signals, namely $ND_1$ 154-1, $ND_2$ 154-2, $ND_3$ 154-3, and $ND_4$ 154-4, collectively referred to as the skewed signals ND 154, are derived from the skew circuit 150.

In addition, the pad detection and logic generation circuit 152 also receives input from the pre-driver signals 148 and the skewed signals ND 154. The pad detection and logic generation circuit 152 detects controls signals triggering the transition in the IO pad 106 and generates a short duration pulse, referred to as short pulse or dynamic bias signal, for every imminent transition in the pad signal 136. Two sets of the transition pulses are generated and each of them is applied to the gates of the n-channel and p-channel stress transistors respectively. The short pulse switches between two voltage levels, for example, an IO buffer supply voltage ($V_{HIGH}$) and a reference voltage ($V_{MID}$), in the case of an n-channel circuit for driving the IO pad 106 from logic high towards logic low. But for the case of a p-channel route, i.e., for driving the IO pad 106 to the logic high, the short pulse switches between the reference voltage $V_{MID}$ and an internally generated voltage ($V_{INT}$).

Thus, the driver 112 receives the level shifted signals PL 146-1 and PR 146-2, the pre-driver signals PLL 148-1 and PRR 148-2, the skewed signals 154, and the short pulse. Such a configuration facilitates the driver 112 to have maximum achievable current carrying capacity at a particular bias and the PVT conditions without causing any of its transistors to get stressed. The transistors in the driver 112 that are likely to get stressed will be hereinafter referred to as stress transistors. Generally, any transistor in the driver 112 is probable to get stressed. As a result, there can be both p-channel stress transistors and n-channel stress transistors in the driver 112.

The driver 112 further ensures that none of the transistors get stressed due to the use of various dynamically generated signals obtained from various units such as the pre-driver 120, the level shifter 118, the skew circuit 150, and the pad detection and logic generation circuit 152. Such signals are a function of the current state of the IO pad 106, the IO buffer supply voltage $V_{HIGH}$, and the conditioned data signals 142 from the core 104. Further, the short pulse received during every transition in the pad signal 136 helps to diode connect the stress transistor in the n-loop during a pulse period and connects the stress, typically under stress, to the reference voltage (for example $V_{MID}$) at all other instances. This helps in minimizing stress, particularly, at higher speeds.

RECEIVE MODE: Consider another scenario in which the receive mode of operation is selected. In one embodiment, the IO signal 156 from the IO pad 106 is connected to the dynamic receiver reference generator 122. The IO signal 156 is conditioned to yield a conditioned IO signal 158. Based on the conditioned IO signal 158, the dynamic receiver reference generator 122 generates dynamic receiver reference signals for the receiver 124. Similar to the dynamic driver reference generator 116, the dynamic receiver reference generator 122 generates two pairs of complementary and differential reference signals at two common mode levels (CM1, CM2). For example, a first pair of dynamic receiver reference signals RML 160-1 and RMR 160-2 (complement of RML 160-1) at a common mode level CM1 and a second pair of dynamic receiver reference signals RPL 160-3 and RPR 160-4 (complement of RPL 160-3) at a common mode level CM2 are obtained. All the dynamic receiver reference signals are hereinafter represented collectively as dynamic receiver reference signals 160.

In one embodiment, the receiver 124 receives the dynamic receiver reference signals 160 and generates the core signal 140 in such a way that none of the transistors in the receiver 124 get stressed. This will be further explained in the figures to follow.

Figure 2A:
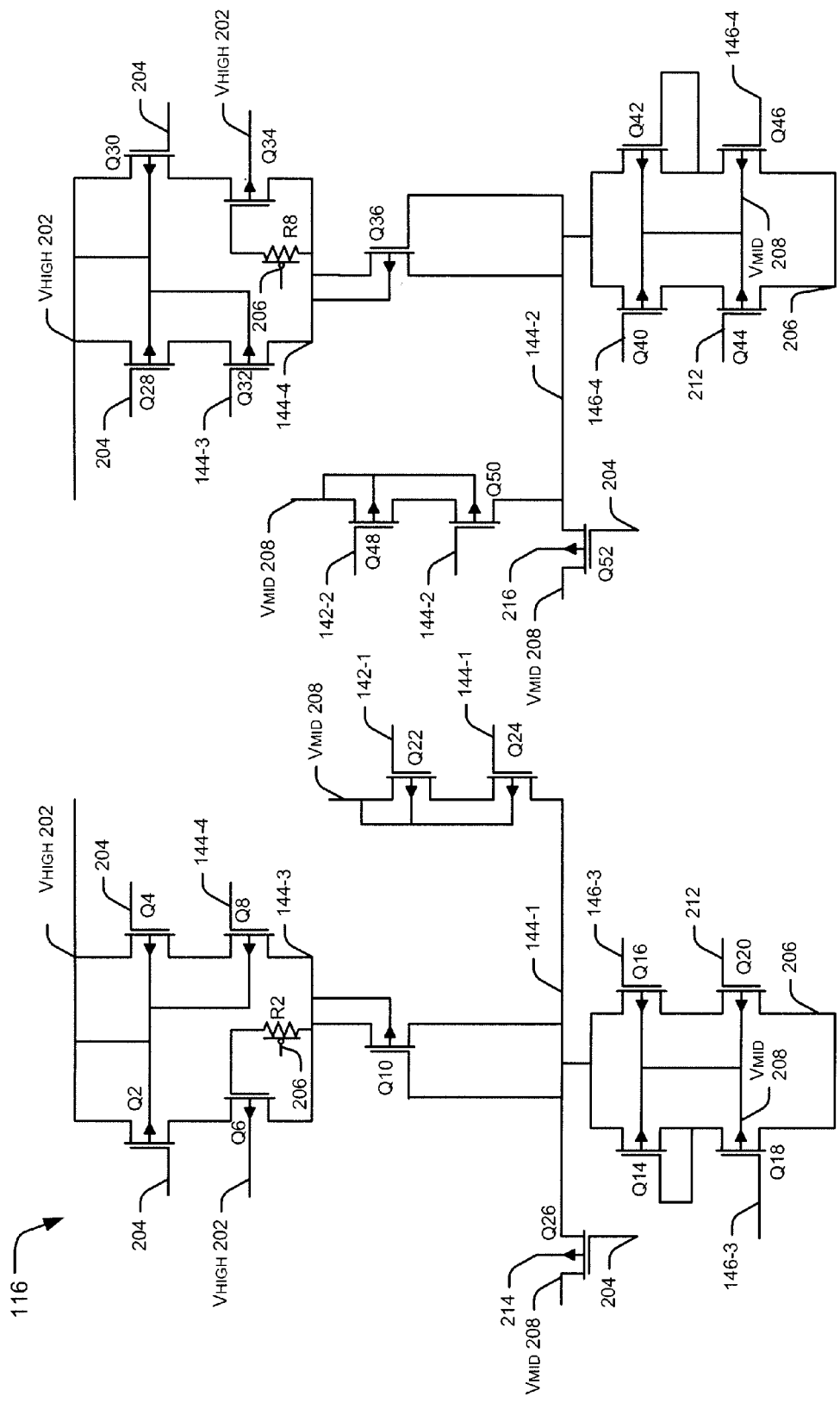
FIG. 2(a) is a circuit schematic diagram illustrating an exemplary dynamic driver reference generator, according to an embodiment of the present subject matter.

FIG. 2(a) is a circuit schematic diagram illustrating an exemplary dynamic driver reference generator 116, according to an embodiment of the present subject matter. The exemplary dynamic driver reference generator 116, is implemented using 28 Angstrom (Å) transistors $Q_2, Q_4, \ldots, Q_{10}$, $Q_{14}, Q_{16}, \ldots, Q_{36}, Q_{40}, Q_{42}, \ldots, Q_{52}$ and resistors, $R_2$, and $R_4$. The configuration herein has been shown as an example and other configurations may be possible, as will be understood by a person skilled in the art.

In one embodiment, the dynamic driver reference generator 116 receives the conditioned data signals cdata 142-1 and cdata* 142-2 from the control logic unit 108. The conditioned data signals 142-1 and 142-2 are fed to the gates of the transistors $Q_{22}$ and $Q_{48}$, respectively. In one embodiment, the dynamic driver reference generator 116 receives a feedback from the level shifter 118 in the form of the level shifted signals NL 146-3 and NR 146-4 at the gate terminals of $Q_{16}$, $Q_{18}$, $Q_{40}$, and $Q_{46}$. In another embodiment, the dynamic driver reference generator 116 is configured to receive both the conditioned data signals 142 and the level shifted signals NL 146-3 and NR 146-4. In yet another embodiment, the conditioned data signals 142 may be fed directly to dynamic driver reference generator 116.

Based at least on the feedback from the level shifter 118, the conditioned data signals 142 and an IO buffer supply voltage $V_{HIGH}$ 202, the dynamic driver reference generator 116 generates reference signals at two common mode levels. For example, the dynamic driver reference signals MIDML 144-1 and MIDMR 144-2 at a common mode level CM1, and the dynamic driver reference signals MIDPL 144-3 and MIDPR 144-4 at a common mode level CM2 are obtained. The MIDPL 144-3 and MIDPR 144-4 are complementary to each other, and the MIDML 144-1 is a complement of the MIDMR 144-2.

The MIDML 144-1 is obtained at a drain terminal of transistor $Q_{10}$ and the MIDPL 144-3 is obtained at drain terminals of transistors $Q_8$ and $Q_6$. The MIDMR 144-2 is obtained at a drain terminal of transistor $Q_{36}$ and the MIDPR 144-4 is obtained at the drain terminals of the transistors $Q_{32}$ and $Q_{34}$. It should be noted that the gate terminals of transistors $Q_{10}$ and $Q_{36}$ are directly connected to MIDML 144-1 and MIDMR 144-2 respectively. The IO buffer supply voltage $V_{HIGH}$ 202 is applied at the source terminals of the transistors $Q_2, Q_4, Q_{28}$, and $Q_{30}$. Also, the drain terminals of transistors $Q_{18}, Q_{20}, Q_{44}$ and $Q_{46}$ are connected to ground 206.

Figure 2B:
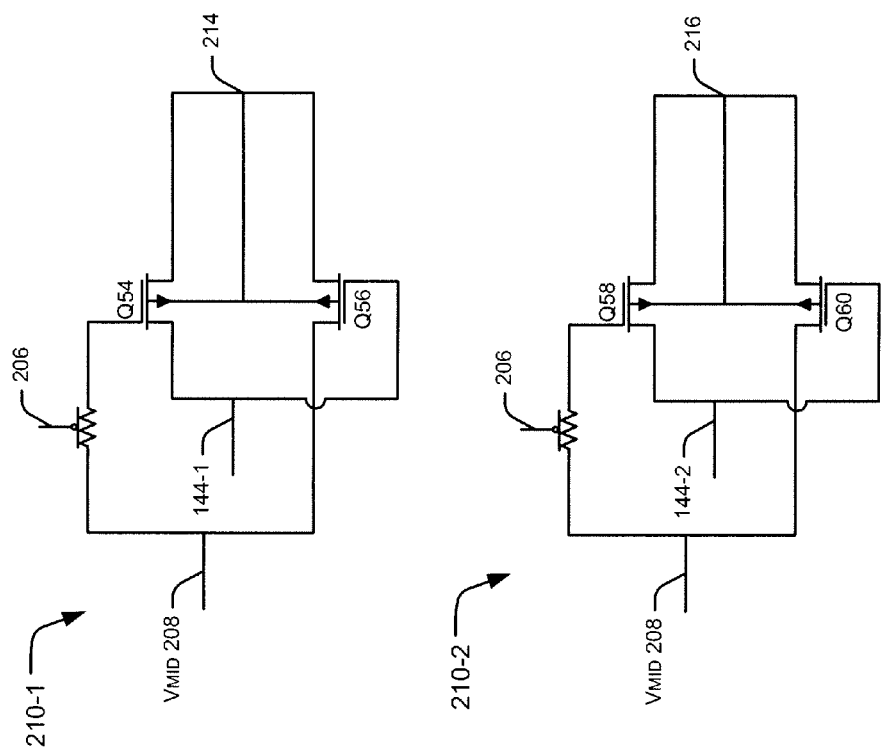
FIG. 2(b) illustrates a circuit schematic diagram of a bulk comparison circuit for the dynamic driver reference generator, in accordance with an embodiment of the present subject matter.

Further, source terminals of transistors $Q_{26}$ and $Q_{52}$ are connected to the reference voltage $V_{MID}$ 208, which can be, for example, 1.8 V, while the substrates are tied to the bulk comparison circuits 210-1 and 210-2, respectively, as shown in FIG. 2(b). The bulk comparison circuit 210-1, designed using the transistors $Q_{54}$ and $Q_{56}$, compares the $V_{MID}$ 208 and the MIDML 144-1 to generate BULKL 214. Based on the comparison, the substrate of the transistor $Q_{26}$ is shorted to a voltage greater between the two. Similarly, the bulk comparison circuit 210-2, designed using transistors $Q_{58}$ and $Q_{60}$, compares the $V_{MID}$ 208 and the MIDMR 144-2 to generate BULKR 216, which is provided to substrate of transistor $Q_{52}$.

Further, the dynamic driver reference generator 116 can work in low power mode as well in multiple supply ranges to provide the dynamic reference bias signals 144. For enabling such a mode, signals from the control signal bus 134, such as the mode selection signals 204 are applied at the gate terminals of transistors $Q_2, Q_4, Q_{26}, Q_{28}, Q_{30}, Q_{52}$ and a control signal 212 is applied at the gate terminals of the transistors $Q_{20}$ and $Q_{44}$. The control signal 212 is high when the core 104 is switched off. Also, the mode selections signals 204 are at $V_{MID}$ 208 when the core 104 is switched off.

The dynamic driver reference generator 116 described herein utilizes the dynamic level shift stages not limited by the VT of the transistors, as in the conventional source follower architectures, thereby setting the swing and the common mode offsets to a given set of reference signals best suited for a given performance at a particular VT. In the embodiment described herein, the dynamic driver reference generator 116 is process invariant in the sense that most of the transistors are p-channel MOSFETs. The operation of the dynamic driver reference generator 116 will be understood with better clarity in conjunction with FIG. 3

In another embodiment, the dynamic driver reference generator 116 includes a plurality of source followers having at least one variable current source. In said implementation, the dynamic driver reference generator 116 includes a first current source, a first variable current source, a second current source, and a second variable current source. The first variable current source is dependent on the conditioned data signal cdata 142-1 and the IO buffer supply voltage $V_{HIGH}$ 202, and the second variable current source dynamically changes with respect to a change in the conditioned data signal cdata* 142-2 and the $V_{HIGH}$ 202. Accordingly, the MIDML 144-1 and the MIDMR 144-2 are generated at the common mode level CM1. In a similar fashion, the MIDPL 144-3 and the MIDPR 144-4 are generated at the common mode level CM2.

Figure 3:
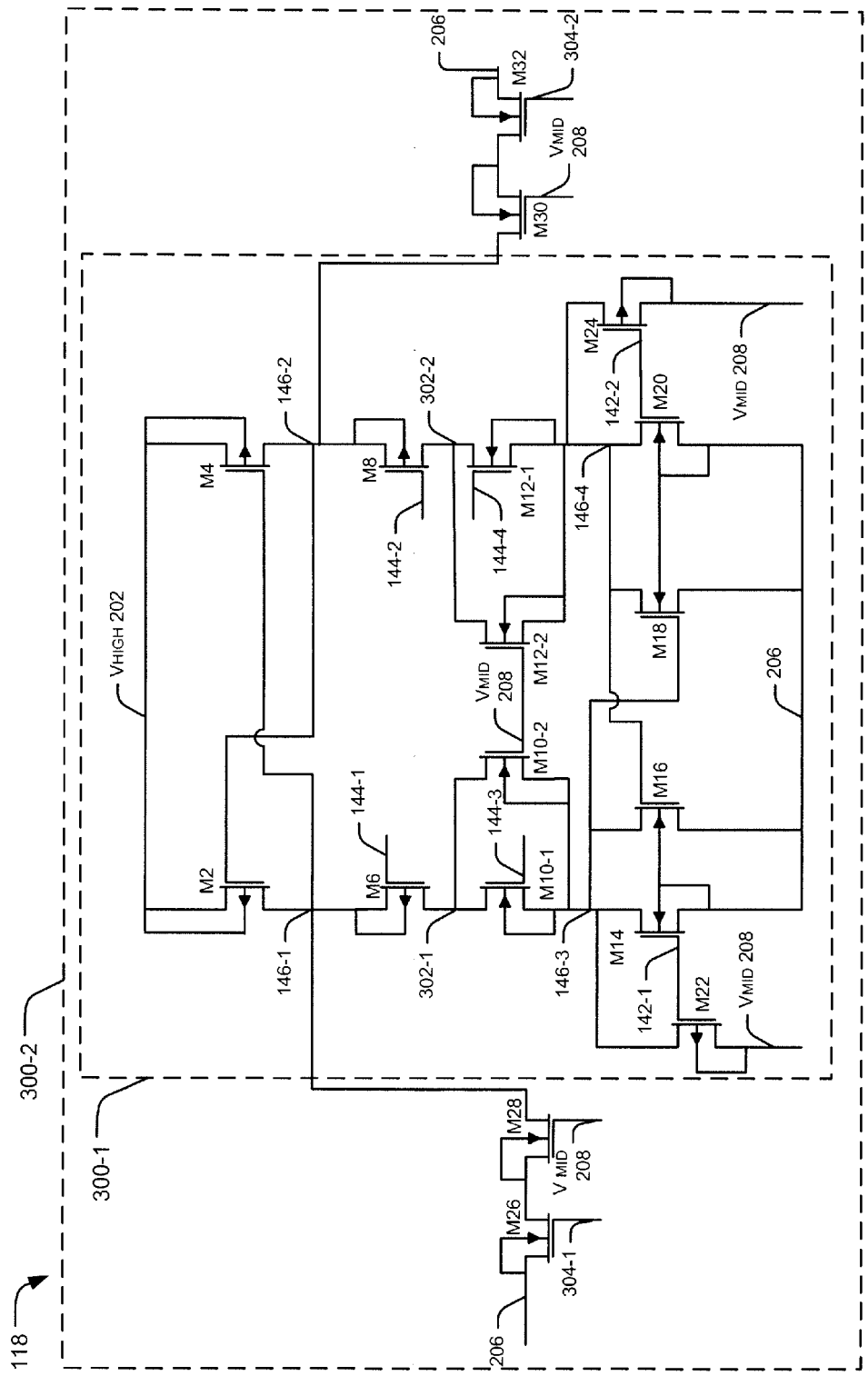
FIG. 3 is an exemplary circuit schematic diagram illustrating a level shifter, according to an embodiment of the present subject matter.

FIG. 3 is a circuit schematic diagram illustrating an exemplary level shifter 118, according to an embodiment of the present subject matter. In said embodiment, the level shifter 118 is implemented using both 28 Å p-channel and n-channel MOSFETs, $M_2, M_4, \ldots, M_{40}$. The connections between the transistors are depicted in the circuit schematic diagram 300. The level shifter 118 is configured to work in various modes like the low power supply mode, the zero current consumption (IDDQ) mode, and the normal mode. However, it can be configured to work in other modes as well, as will be understood by a person skilled in the art. For example, when the level shifter 118 is operated in the normal mode, a level shifter 300-1 is triggered, whereas a level shifter 300-2 is triggered when the low power supply mode is desired.

NORMAL MODE: The IO buffer power supply $V_{HIGH}$ 202 is provided to the level shifter 118 at source terminals of the transistors $M_2$ and $M_4$. The conditioned data signals 142, corresponding to logic '0' and logic '1', received from the control logic unit 108 are applied at gate terminals of the transistors $M_{14}, M_{22}, M_{20}$, and $M_{24}$. For example, the transistors $M_{14}$ and $M_{22}$ receive the cdata 142-1 at their respective gate terminals, while the transistors $M_{20}$ and $M_{24}$ receive the cdata* 142-2 as gating signals.

The level shifter 118 also receives dynamic driver reference signals 144 from the dynamic driver reference generator 116. The dynamic driver reference signals MIDML 144-1 and MIDMR 144-2 are applied to gate terminals of the transistors $M_6$ and $M_8$, respectively. Gates of transistors $M_{10-1}$ and $M_{12-1}$ are activated by the other pair of dynamic driver reference signals, namely, the MIDPL 144-3 and MIDPR 144-4. The characteristics of the dynamic driver reference signals 144 have been addressed in detail in FIG. 2. Further, the gates of transistors $M_{10-1}$ and $M_{10-2}$ are tied together to the reference voltage $V_{MID}$ 208. In one example, the aspect ratio (width to length ratio) of transistors $M_{10-1}$ to $M_{10-2}$ is about 2:1. Similarly, the aspect ratio of transistors $M_{12-1}$ to $M_{12-2}$ is also 2:1.

In operation, when the cdata 142-1 increases, the transistor $M_{14}$ being an n-channel transistor, pulls the NL 146-3 down towards the ground 206. Now, as the transistor $M_{10-2}$ has its gate terminal tied to the $V_{MID}$ 208, an output node OUTL 302-1 is pulled low. Thus, the transistor $M_{10-2}$ has a large overdrive because both the NL 146-3 and the output node OUTL 302-1 are being pulled down. This is further explained in the following paragraph(s).

As shown in the figure, the OUTL 302-1 is connected to a drain of the p-channel transistor $M_6$. After initial trigger by the n-channel transistors $M_{14}$ and $M_{10-2}$, the transistor $M_6$ is pulled in saturation, making it a constant current device thus pulling the OUTL 302-1 with the strength of the current source, thereby, gradually converging to a constant value. As a result, conventionally, the OUTL 302-1 is slewed up with a constant rate, which is in contrast with the effect that the lower n-channel transistor $M_{14}$ is attempting to bring, i.e., pulling OUTL 302-1 towards ground 206.

Thus, after the voltage at OUTL 302-1 drops to a value that is the sum of the gate voltage and the threshold voltage of the p-channel transistor $M_6$. This is due to discharge effect owed to the $M_{14}$ transistor, the transistor $M_6$ starts slewing depending on the sizes of the transistors. Considering the practical sizes of transistors in the level shifter 118, the transistors $M_6$ and $M_8$ will appear as weak current sources in contention with the transistors $M_2$ and $M_4$ depending on the situation.

Thus, the lower level of OUTL 302-1 does not contribute in bringing the level shifted signal PL 146-1 down. Therefore, in one embodiment, the dynamic driver reference signal MIDML 144-1 modifies the level shifted signal PL 146-1 in accordance with variations in the cdata 142-1. For the purpose, the level shifter 118 derives the dynamic driver reference signals 144 from the dynamic receiver reference generator 116.

Referring back to FIG. 2, the level shifted signal NL 146-3 from the level shifter 118 is provided at a gate terminal of the transistor $Q_{16}$. Because of this, the MIDML 144-1 is pulled down towards the ground 206. Also, when the dynamic driver reference signal MIDML 144-1 is applied at the gate of the transistor $M_6$ as illustrated in FIG. 3, the PL 146-1 is pulled low or discharges at a much faster rate than before. In other words, the gate of the concerned p-channel transistors, i.e., $M_6$ is pulled down thus providing a fast discharge path for the PL 146-1.

Further, the PL 146-1 is applied at a gate of the transistor $M_4$, which is triggered when the PL 146-1 goes low and, as a result, the PR 146-2 moves towards the $V_{HIGH}$ 202 or logic "1". This makes the transistor $M_2$ a weak transistor. As a result of the positive feedback from another limb of the level shifter 118, the transition gets a further boost and the PL 146-1 goes further low. In this manner, a faster operation, in comparison to conventional designs, is achieved by using dynamically generated signals based at least on the conditioned data signals 142. This is particularly helpful at high frequencies, i.e., at about 100 MHz. At even higher frequencies, approaching 180 Mhz, the conditioned data signals 142 can be used directly into the dynamic driver reference generator 116 instead of the level shifted signals 146. Such a design helps to speed the IO buffer 102 up, while keeping the stress within the limits.

Further, since the cdata 142-1 is increasing, the complementary version of the cdata 142-1, i.e., cdata* 142-2 (applied at the gate of transistors $M_{20}$ and $M_{24}$) decreases. As a result, the NR 146-4 increases and the transistor $M_{12}$ loses the overdrive, thereby leading to a slow behavior of the level shifter 118. To improve the speed of operation, a reference signal dynamically varying with respect to the cdata* 142-2 is applied at the gate terminal of transistor $M_8$. This signal is the complementary version of the MIDML 144-2. Alternatively, the MIDMR 144-2 is applied as a gate signal to the transistor $M_8$.

Referring back to FIG. 2, as the NR 146-4 increases, MIDMR 144-2 and MIDPR 144-4 also increase. Also, the gate of the transistor $M_{12-1}$ is tied to the MIDPR 144-4, due to which the transistor $M_{12-1}$ never misses the overdrive as its gate terminal follows its source terminal.

Also as the NR 146-4 increases, the MIDPR 144-4 increases and another output node OUTR 302-2 begins to go low at a very fast rate. This helps in increasing the overall operational speed of the level shifter 118. It should be noted that in the embodiment described herein, the transistors $M_6$, $M_8$, $M_{10}$, and $M_{12}$ maintain a constant overdrive as the dynamic driver reference signals 144 vary as the conditioned data signals 142 are changing.

Low Power Supply Mode: As mentioned before, the level shifter 118 is also configured to operate in a low power supply mode. For the purpose, the transistors $M_{26}, \ldots, M_{32}$ become functional. These transistors are arranged in a cascode manner and are operative at low power modes, i.e. the path is only active at lower supply voltages as then the main path is bypassed. In an embodiment, the gate terminals of the transistors $M_{28}$ and $M_{30}$ are connected to the $V_{MID}$ 208. The transistors $M_{26}$ and $M_{32}$ are activated by activation signals 304-1 and 304-2, which are provided when the user intends to work in a low power supply mode, i.e., when the $V_{MID}$ 208 is the main supply in the range (1.6V-2V) of operation. For example, the activation signals 304-1 and 304-2 may be complementary to each other and may be obtained by logically AND-ing the conditioned data signals 142 with the $V_{MID}$ 208. In similar embodiments, the level shifter 118 can be configured to work in various other modes as well.

IDDQ Mode: In this mode, the dynamic driver reference generator 116 is switched off and the level shifter 118 receives fixed inputs from the dynamic driver reference generator 116 as designed.

Figure 4:
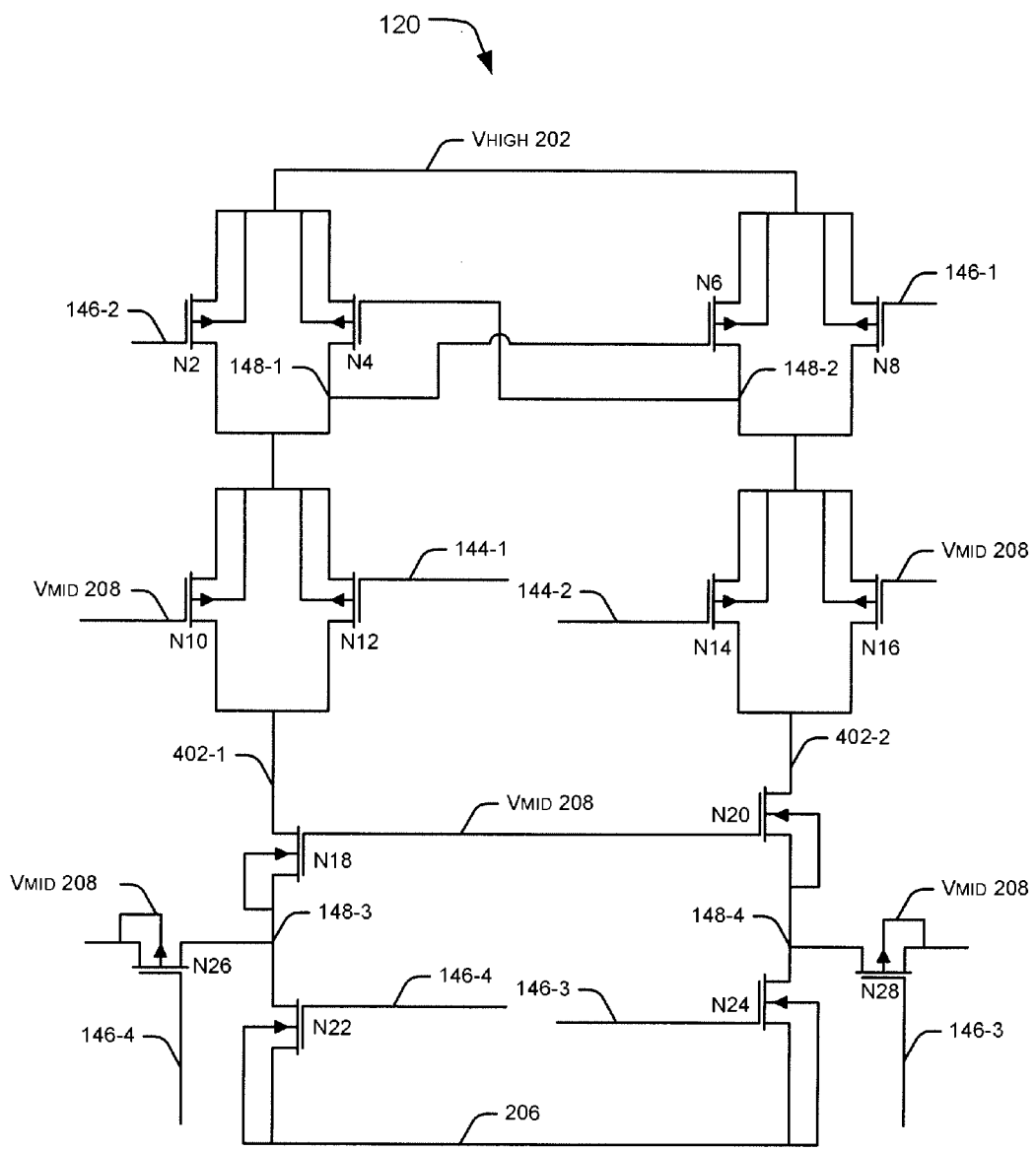
FIG. 4 illustrates an exemplary schematic diagram of a pre-driver, in accordance with an embodiment of the present subject matter.

FIG. 4 illustrates a schematic diagram of the pre-driver 120, in accordance with an embodiment of the present subject matter. In said embodiment, the pre-driver 120 is implemented using 28 Å p-channel and n-channel transistors, namely, $N_2, N_4, \ldots, N_{26}, N_{28}$. The source terminals of transistors $N_2, N_4, N_6,$ and $N_8$ are connected to the $V_{HIGH}$ 202, while the source terminals of $N_{26}$ and $N_{28}$ are tied to the $V_{MID}$ 208. The $V_{MID}$ 208 is also applied at gates of $N_{10}, N_{16}, N_{18},$ and $N_{20}$. The gates of $N_{22}$ and $N_{24}$ are connected to the ground 206. The pre-driver 120 also includes two output nodes, namely OUTLL 402-1 and OUTRR 402-2.

In one embodiment, the pre-driver 120 is connected to the level shifter 118 and receives the level shifted signals 146. The pre-driver 120 also receives two dynamic driver reference signals the MIDML 144-1 and the MIDMR 144-2 from the dynamic driver receive generator 116. Accordingly, the pre-driver 120 generates two sets of complementary and differential pre-driver signals, namely the PLL 148-1, the PRR 148-2, the NLL 148-3, and the NRR 148-4, which are at the same common mode levels (CM3, CM4) as that of the PL 146-1, the PR 146-2, the NL 146-3, and the NR 146-4, respectively. In one example, the aspect ratio of the transistors $N_{12}$ to $N_{10}$ is 2:1. Similarly, the aspect ratio of the transistors $N_{14}$ to $N_{16}$ is 2:1.

The pre-driver 120 is configured to boost the gain of the level shifted signals 146 and to control rise and fall times at the gate terminals of the driver 112. Utilizing the signals from the level shifter 118 and utilizing similar architecture as the level shifter 118, the p-channel and n-channel transistors form parallel paths while deriving trigger signals from the conditioned data signals 142. This inherently increases the output drive and helps in positive feedback loop since the level shifted signals 146 have already set the node voltages to a particular level even before the conditioned signals 142 arrive.

In operation, when the NR 146-4 increases, the transistor $N_{22}$ turns ON and the NLL 148-3 is pulled low towards the ground 206. Further, since the $V_{MID}$ 208 is applied at the gate of transistor $N_{18}$, the output node OUTLL 402-1 is also pulled low to a constant level. Even though OUTLL 402-1 is connected to the drain of $N_{12}$, the level of the OUTLL 402-1 does not contribute in changing the level of the PLL 148-1 down. Therefore, in one embodiment, the dynamic driver reference signal MIDML 144-1 modifies the pre-driver signal PLL 148-1 in accordance with variations in the cdata 142-1 and the cdata* 142-2, the level shifted signals 146, and the IO buffer supply voltage $V_{HIGH}$ 202.

Figure 5A:
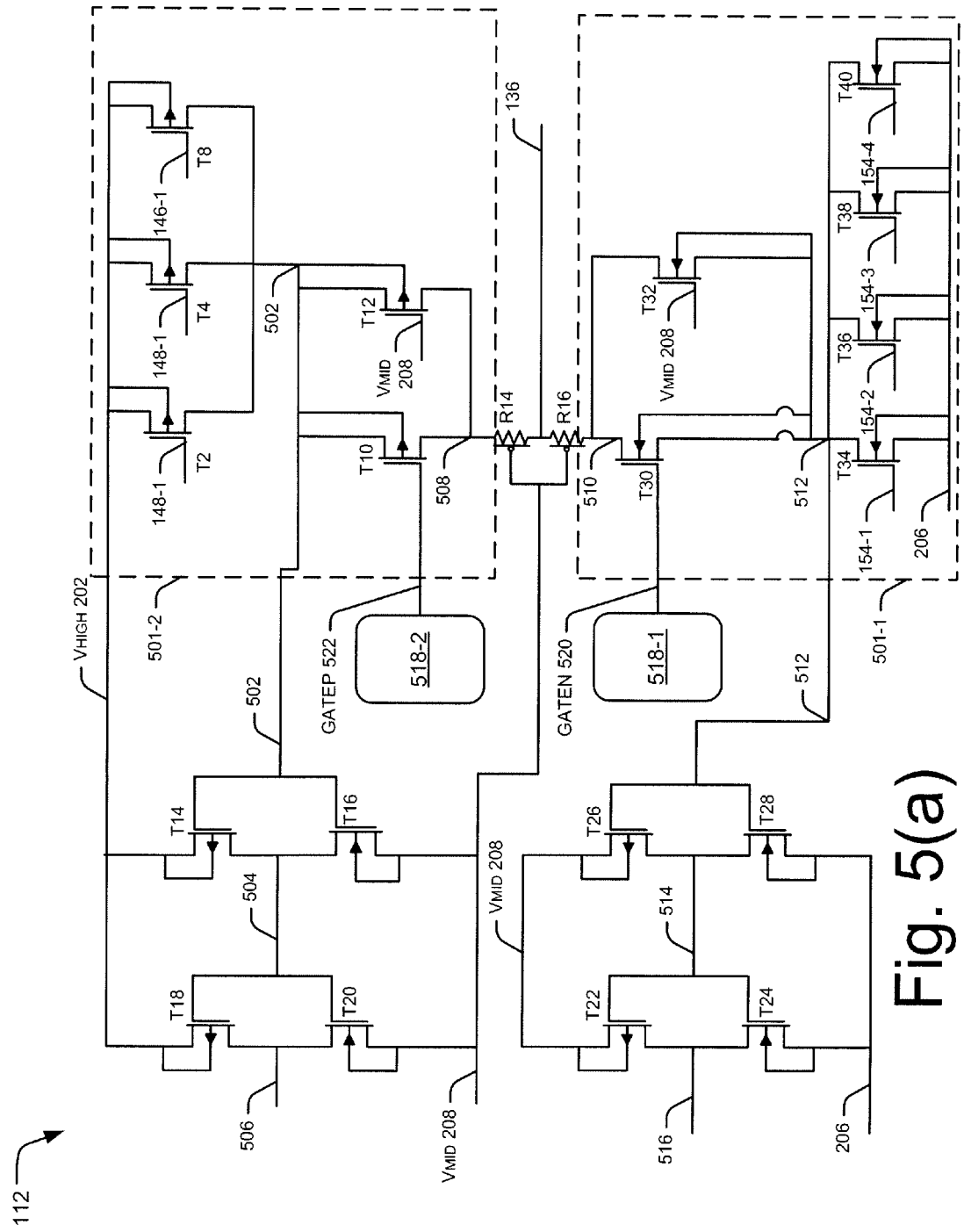
FIG. 5(a) illustrates an exemplary circuit schematic diagram of a driver included in the IO buffer, in accordance with an embodiment of the present subject matter.

FIGS. 5(a) and (b) illustrate circuit schematic diagram of the driver 112 included in the IO buffer 102, in accordance with an embodiment of the present subject matter. The driver 112, in one embodiment, is designed using thin oxide transistors, for example, 28 Angstrom n-channel and p-channel transistors $T_2, T_4, \ldots, T_{40}$. Even though the circuit schematic diagram has been implemented in both pull-up and pull-down paths, the description hereinafter is directed toward reducing the stress on the n-channel cascode transistors, $T_{30}$ and $T_{32}$ in an n-channel circuit 501-1. It will be understood that the description may be extended for reducing stress on the p-channel transistors like transistor $T_{10}$ in a p-channel circuit 501-2.

In said embodiment, the transistors $T_2$ and $T_4$ receive the pre-driver signal PLL 148-1 from the pre-driver 120 and the transistor $T_8$ receives, at its gate terminal, the level shifted signal PL 146-1 from the level shifter 118 at its gate terminal. This automatically skews the signals at the gates of the driver 112 thereby controlling the trigger for the IO pad 106 and hence controlling the slew of the output voltage. The drain terminals of transistors $T_2$, $T_4$, and $T_8$ are tied to a common intermediate node to provide an intermediate signal at DRP 502. The intermediate signal at DRP 502 is an input to a first inverter stage, which is configured using transistors $T_{14}$ and $T_{16}$, to provide an inverted output at DRPO 504. The DRPO 504 is connected to a second inverter stage, which is configured using transistors $T_{18}$ and $T_{20}$, to yield a signal at DRPE 506 in phase with the signal at the DRP 502.

The DRP 502 is also connected to source terminals of two transistors, $T_{10}$ and $T_{12}$, while the drain terminals of these transistors are connected to a common node. A signal obtained at the common node is hereinafter referred to as OUTDP 508. The signal OUTDP 508 is connected to two resistors $R_{14}$ and $R_{16}$, connected in series. A voltage $V_{PAD}$ 138 is obtained at a junction of the two resistors $R_{14}$ and $R_{16}$. The $V_{PAD}$ 138 is the voltage of the pad signal 136. Another end of the resistor $R_{16}$, that is OUTDN 510, is connected to the drains of transistors $T_{30}$ and $T_{32}$.

The cascode transistor $T_{32}$ receives a fixed bias from $V_{MID}$ 208 unlike $T_{32}$, which receives a dynamic bias to control the stress on the cascode transistor $T_{32}$. Such a design helps distribute the drive area between the transistors $T_{30}$ and $T_{32}$, thereby efficiently controlling the stress.

Further, the source terminals of the transistors $T_{30}$ and $T_{32}$ are connected together at a common terminal DRN 512. The intermediate signal at DRN 512 is an input to a third inverter stage, which is configured using transistors $T_{26}$ and $T_{28}$, to provide an inverted output at DRNO 514. The DRNO 514 is connected to another inverter stage, which is configured using transistors $T_{22}$ and $T_{24}$, to yield a signal at DRNE 518 in phase with the signal at the DRN 512.

The DRN 512 is also connected to the drain terminals of four transistors $T_{34}$, $T_{36}$, $T_{38}$, and $T_{40}$. Each of these transistors receives skewed signals $ND_1$ 154-1, $ND_2$ 154-2, $ND_3$ 154-3, and $ND_4$ 154-4, respectively, from the skew circuit 150, as explained in FIG. 1. The skewed signals $ND_1$ 154-1, $ND_2$ 154-2, $ND_3$ 154-3, and $ND_4$ 154-4, are skewed versions of the pre-driver signals NLL 148-3 and NRR 148-4.

Figure 5B:
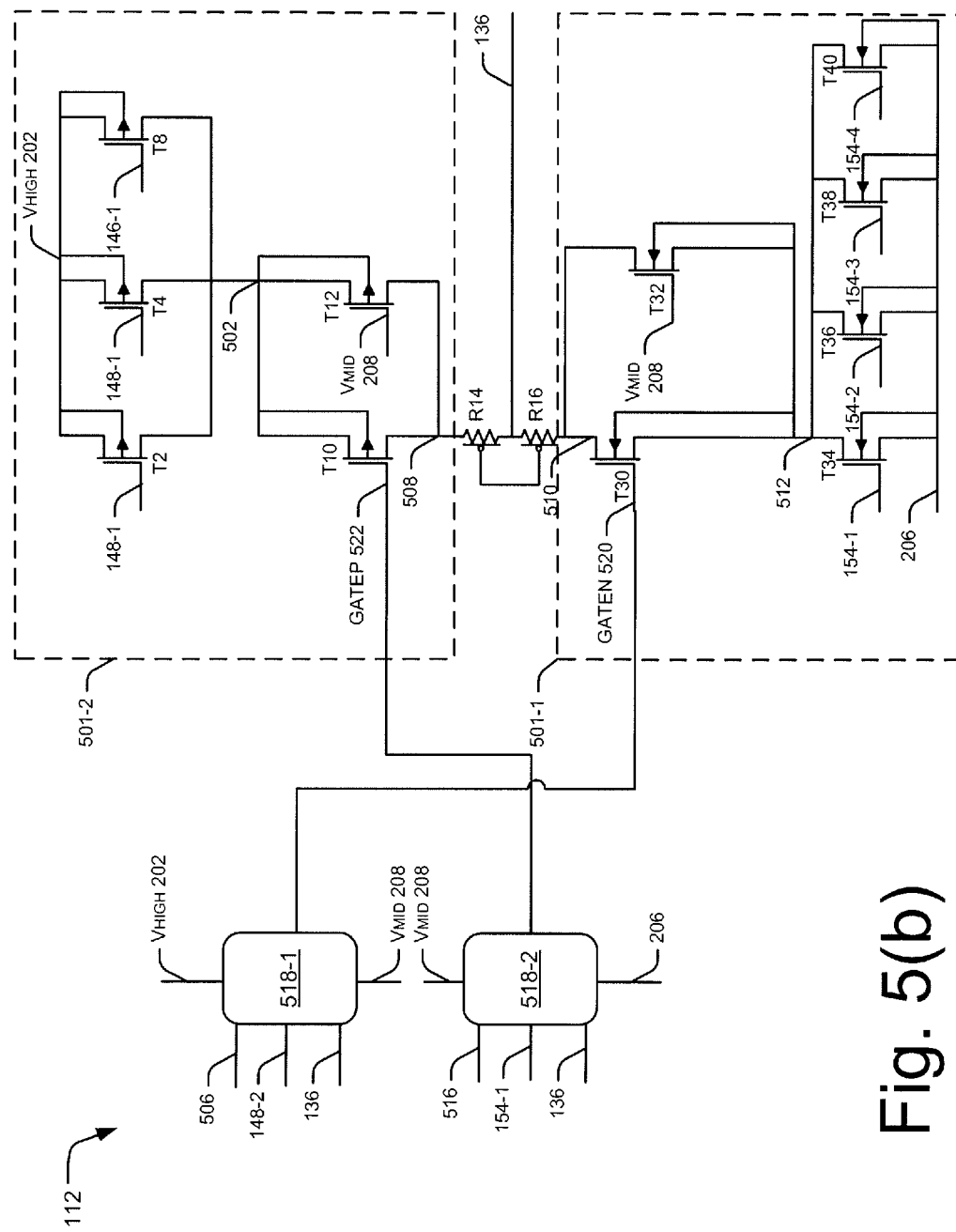
FIG. 5(b) illustrates an exemplary architecture of a driver, in accordance with another embodiment of the present subject matter.

In said embodiment, the driver 112 also includes a dynamic bias unit, which includes an n-bias unit 518-1 or a p-bias unit 518-2 (as shown in FIG. 5(b)) based on the whether pull-up path is activated or pull-down. In one embodiment, the n-bias unit 518-1 receives the signal from DRPE 506, the pre-driver signal PRR 148-2, and the pad signal 136. Based on the current state of the IO pad 106, as indicated by the pad signal 136 fed back to the n-bias 518-1 at DRPE 506, and on the pre-driver signal PRR 148-2, a short pulse is generated. The short pulse modifies the gate voltage at a gate terminal of the transistor $T_{30}$, called GATEN 520 in response to a variation in source voltage of a stress transistor, for example, $T_{30}$ or $T_{32}$. As a result, the dynamic voltage across any two nodes of a particular transistor is almost constant. Therefore, even during transients, the gate-to-source voltage variations are kept within pre-defined limits. In an example, the pre-defined limits may be defined by an IO buffer architecture or specifications of the IO buffer 102.

Similarly, the transistors $T_{10}$ and $T_{12}$ are provided with a short pulse at GATEP 522 using the p-bias unit 518-2. The p-bias unit 518-2 receives inputs from a node DRNE 516, the skewed signal $ND_1$ 154-1 and the pad signal 136. The voltage at the GATEP 522 dynamically varies as the source voltage of the transistors $T_{10}$ and $T_{12}$ changes. Thus, on an average, the gate-to-source voltage across any stress transistor in either the n-channel circuit 501-1 or the p-channel circuit 501-2 is almost constant. It should be noted that the driver 112 does not utilize clock signal(s) for synchronization with the data signal 132. Also, while the n-channel circuit 501-1 does not swing rail to rail, the p-channel circuit 501-2 swings from the reference voltage $V_{MID}$ 208 to an intermediate voltage $V_{THP}$ (where $V_{THP}$ is the threshold voltage of the p-channel cascode transistor).

Even though the n-bias unit 518-1 and p-bias unit 518-2 have been shown to operate on the basis of specific signals, it will be understood that alternate configurations may be possible as will be understood by a person skilled in the art. For example, instead of PRR 148-2, PLL 148-1 or level shifter signals 146 may be used with some structural variations. The circuit configurations of the n-bias unit 518-1 and the p-bias unit 518-2 are further elaborated in the following figures.

Figure 5C:
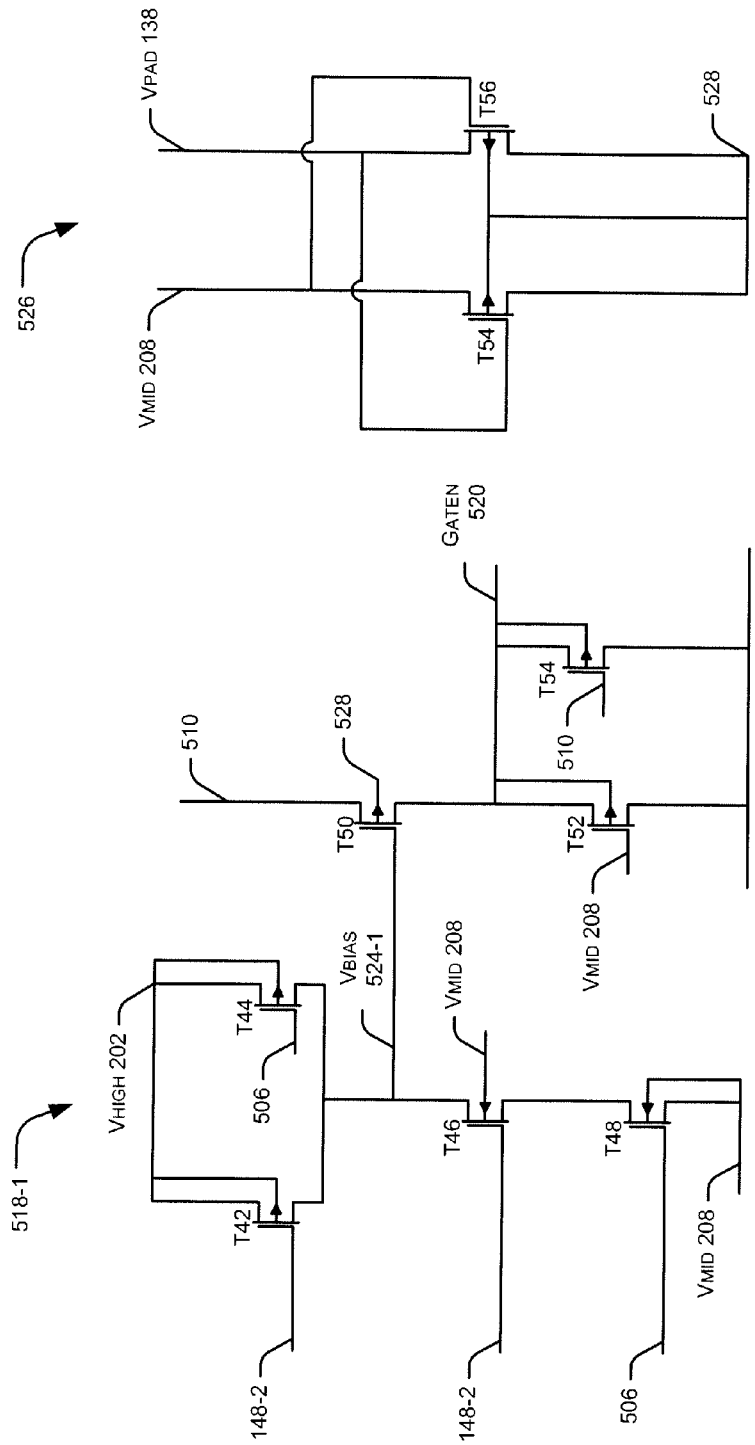
FIG. 5(c) illustrates an exemplary circuit schematic diagram of an n-bias unit and a bulk comparison circuit for the driver, in accordance with an embodiment of the present subject matter.

Referring to FIG. 5(c), the n-bias unit 518-1, in one embodiment, includes a NAND logic designed using transistors $T_{42}, \ldots, T_{48}$. The inputs of the n-bias unit 518-1 are the pre-drive signal PRR 148-2 and the signal received at DRPE 506 from the driver 112. One of the outputs of the n-bias unit 518-1, hereinafter referred to as $V_{BIASN}$ 524-1, can switch between the IO buffer supply voltage $V_{HIGH}$ 202 and the reference voltage $V_{MID}$ 208. The $V_{BIASN}$ 524-1 is then applied at the gate terminal of the transistor $T_{50}$ of the n-bias unit 518-1, as shown in FIG. 5(a). The drain terminal of the transistor $T_{50}$ is connected to OUTDN 510, which, in one example, receives the pad signal 136 through the resistor $R_{16}$. The n-bias unit 518-1 is also connected to the bulk comparison circuit 526, which compares the $V_{MID}$ 208 and the $V_{PAD}$ 138. Based on the comparison, the substrate of the transistor $T_{50}$ is shorted to a voltage greater between the two. Also, the transistors $T_{50}$ and $T_{52}$ invert $V_{BIASN}$ 524-1 to provide an inverted $V_{BIASN}$ 524-1 or a short pulse at the GATEN 520. As mentioned before, the GATEN 520, is tied to the gate terminal of transistor $T_{30}$ and is configured to vary as the source voltage varies. The swing at GATEN 520, in one example, is determined by the ratio of the sizes of the transistors shown in the FIG. 5(c), $T_{50}$ $T_{52}$, and $T_{54}$ respectively. The swing for example may be $K*(V_{HIGH} 202-V_{MID}208)$, where K<1 and is determined by the aspect ratio of the transistors.

Figure 5D:
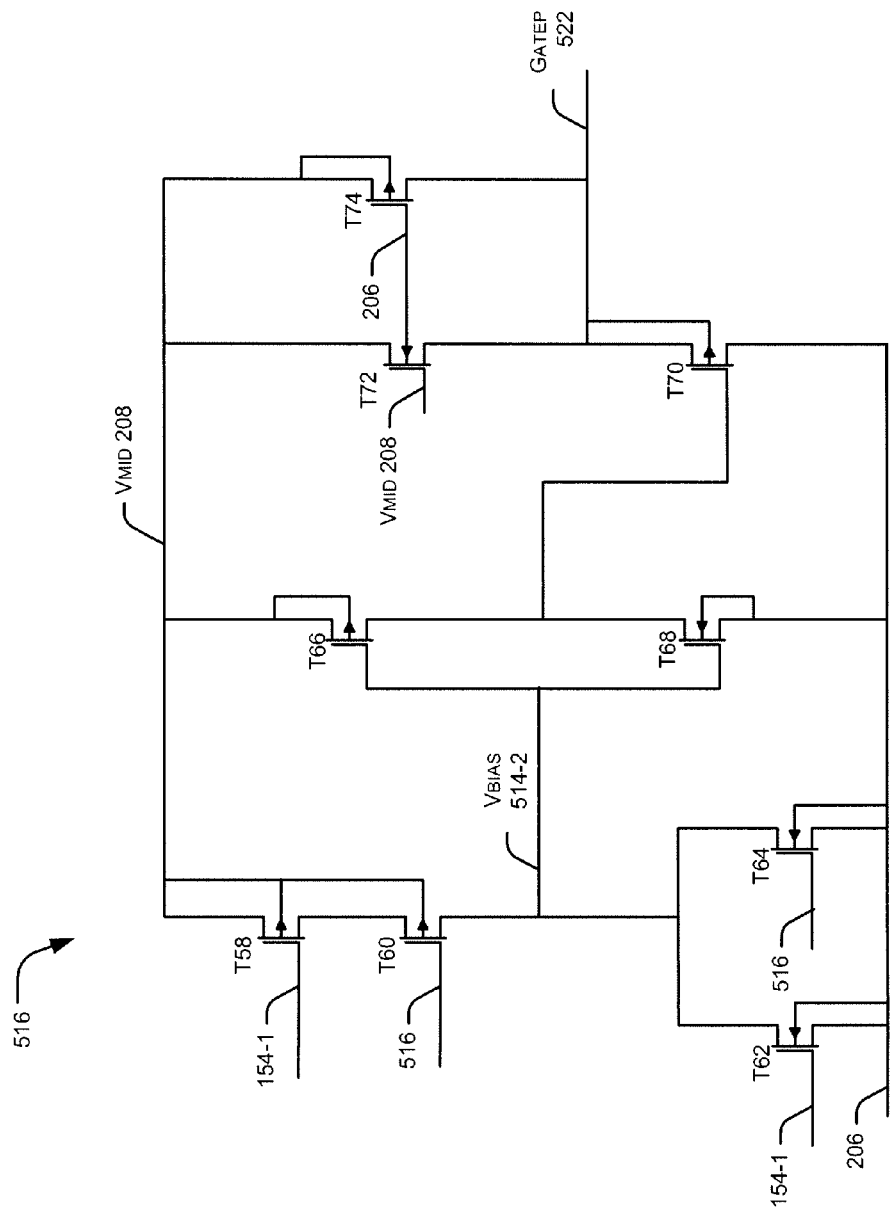
FIG. 5(d) illustrates an exemplary circuit schematic diagram of a p-bias unit for the driver, in accordance with an embodiment of the present subject matter.

Similarly, the p-bias unit 518-2, as shown in FIG. 5(d) includes a NOR logic designed using transistors $T_{58}, \ldots, T_{64}$. The inputs of the p-bias unit 518-2 are the skewed signal $ND_1$ 154-1 and the signal obtained at the DRNE 516. One of the outputs of the p-bias unit 518-2, hereinafter referred to as $V_{BIASP}$ 524-2, can switch between the reference voltage $V_{MID}$ 208 and ground 206. The $V_{BIASP}$ 524-1 is provided to an arrangement of transistors $T_{66}, \ldots T_{74}$. The drain terminal of the transistor $T_{74}$ is connected to the GATEP 522. The voltage at GATEP 522 is configured to vary as the source voltage across transistor $T_{10}$ varies.

The operation of the driver 112 is now explained with reference to certain examples. However, it will be understood that the examples are provided only for better comprehension without limiting the scope of present subject matter.

Consider that IO pad is maintained at 4 volts, which means that the $V_{PAD}$ 138 is at 4V or the pad signal 136 is at 4V. Now, the DRN 512 is at about $V_{MID}-V_{th}$ volts (where $V_{th}$ is the threshold voltage of transistor $T_{30}$). Here, the transistor $T_{30}$ is a stress transistor, which typically gets stressed when the voltage difference between any of its two terminals exceeds 1.98V. It should be noted that due to the voltage at DRN 512, cascode transistor $T_{30}$ is already stressed. Without the dynamic bias at the gate of $T_{30}$, if a fast pulse is applied at the skewed signals ND 154, it will further pull DRN 512 lower towards the ground 206. The fast pulse is a version of the conditioned data signal cdata 142-1. In such a case, the cascode transistor $T_{30}$ has very low overdrive and may work at low frequencies. However, there is still a possibility that the transistor $T_{30}$ gets stressed even at low frequencies.

Therefore, in one embodiment, voltage at a gate terminal GATEN 520 of the cascode transistor $T_{30}$ is adjusted in such a way that the DRN 512 is pulled up. Due to a contention between the ND 154, which is trying to bring the DRN 512 down, and the GATEP 522, which is trying to pull the DRN 512 up, a resultant voltage across the DRN 512 does not go beyond 1.4V. The contention is maintained until the $V_{PAD}$ 138 reaches a value at which the transistor $T_{30}$ is no longer stressed, for example, at 2V.

To this end, the pad and logic generation circuit 152 detects control signals triggering the transition in the IO pad 106. Accordingly, a short pulse at GATEN 520 is generated in response to every imminent transition in the pad signal 136. Two sets of the transition pulses are generated and each of them is applied to the gates of the n-channel and p-channel stress transistors respectively. The short pulse at GATEN 520 switches between two voltage levels, for example, the IO buffer supply voltage $V_{HIGH}$ 202 and the reference voltage $V_{MID}$ 208, in the case of the n-channel circuit 501-1 for driving the IO pad 106 from logic high towards logic low. Such a pulse helps to diode connect the cascode transistor $T_{30}$ during a pulse period and connects the stress transistor $T_{32}$ to the reference voltage $V_{MID}$ 208 at all the other instances. This helps in reducing stress, particularly, at higher speeds.

Also, the level shifted signal PL 146-1 and the pre-driver signals PLL 148-1 and PRR 148-2 notify beforehand when to expect a transition at the IO pad 106 since the level shifted signals 146 and the pre-driver signals 148 are dependent on the conditioned data signals 142. Accordingly, the n-bias unit 518-1 provides the short pulse that varies between $V_{HIGH}$ 202 and $V_{MID}$ 208. In a similar manner, for the p-channel circuit 501-2, i.e., for driving the IO pad 106 to the logic high, the short pulse at GATEP 522 switches between the reference voltage $V_{MID}$ and an internally generated voltage ($V_{INT}$).

In addition to adjusting the voltage at the DRN 512 by applying $V_{BIAS}$ 514 at the GATEN 522, the skewed signals ND 154 are designed to switch slowly. For the purpose, the skewed signals ND 154 are delayed by about 600 picoseconds with respect to each other. In this fashion, the DRN 512 is pulled up at a rate faster than the rate at which the DRN 512 is discharged such that the transistors $T_{30}$ and $T_{32}$ do not get stressed.

The driver 112 described herein is beneficial in terms of area penalty as the voltage at the gate of the cascode transistor $T_{30}$ can be dynamically adjusted between the operational ranges (1.6V to 2V and 2.6V and 3.6V). Thus, a larger drive is provided whenever required for the pull-up or pull-down operation, thereby saving the area penalty which would otherwise be there in case higher drives are adjusted to maintain stress levels in a typical environment. Additionally, the driver 112 maintains an upper limit of stress at all corners and conditions for all the transistors in the IO buffer 102, while operating at frequencies as high as 200 MHz. Conventional designs either use external reference voltages or triple cascode architectures which occupy an area as large as 40%, however the system 100 described herein uses only thin oxide transistors without affecting the operational speed. This also indicates that the fabrication of such buffers is optimized, which leads to silicon real estate saving. Also since the driver 112 dynamically changes the reference voltages with respect to the current state of the IO pad 106 and the data signals 132 and subsequently feeds dynamically changing reference voltages to all the stages of the IO buffer 102, the overall design is greatly simplified and high operational speeds are achieved. The reliability and stress tolerant features is provided through the use of dynamically generated reference signals.

Figure 6A:
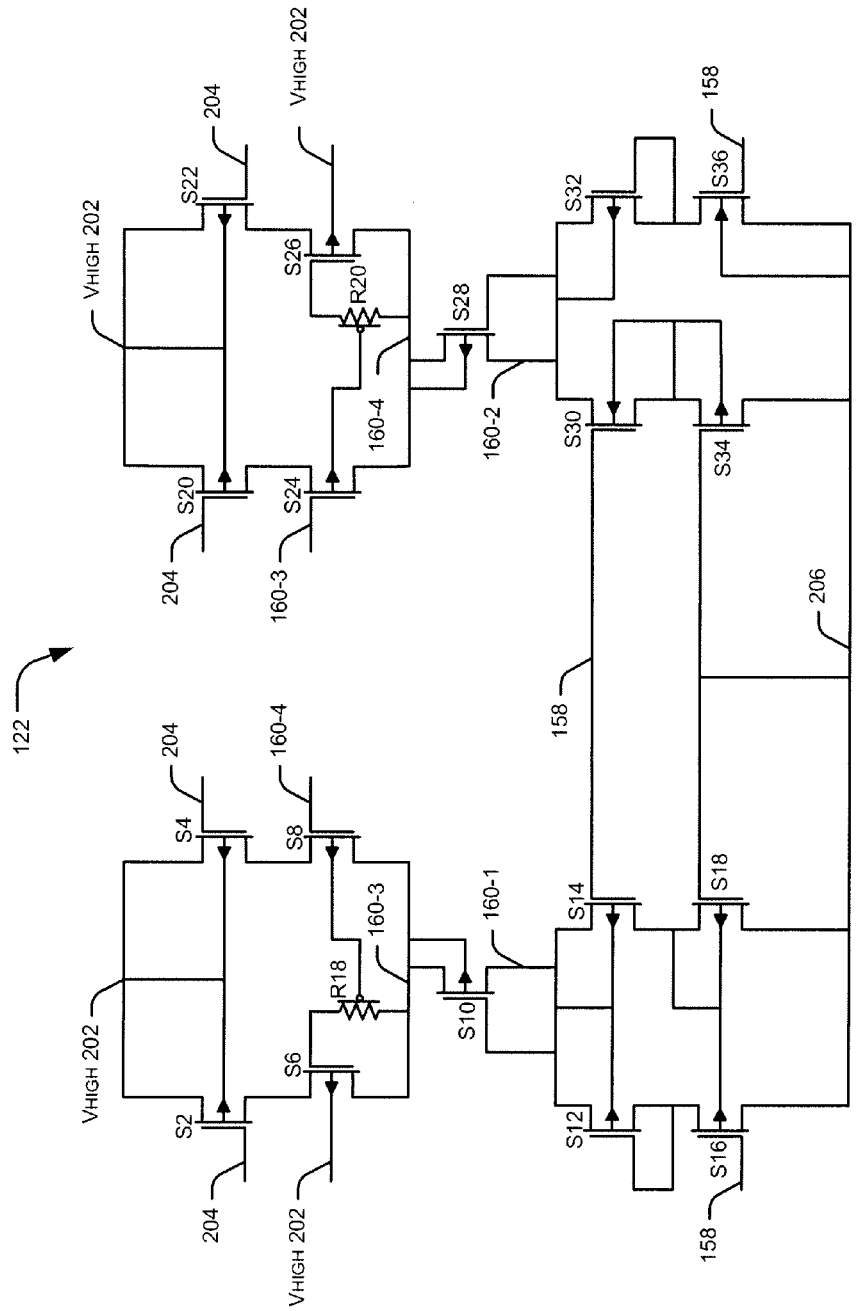
FIG. 6(a) illustrates exemplary schematic diagram of a dynamic receiver reference generator, in accordance with an embodiment of the present subject matter.

FIG. 6(a) and (b) illustrate exemplary schematic diagrams of the dynamic receiver reference generator 122 and the receiver 124, respectively, in accordance with an embodiment of the present subject matter.

In one embodiment, when the user selects the receive mode, the dynamic receiver reference generator 122 of the IO buffer 102 is triggered. For example, the control signal bus 134 of the core 104 is connected to the IO pad 106 and triggers the dynamic receiver reference generator 122. In the receive mode, the IO signal 156 is shifted to a lower core voltage $V_{CORE}$, say at about 1 V. The dynamic receiver reference generator 122 is designed using both 28 Å p-channel and n-channel transistors, namely $S_2, S_4, \ldots, S_{36}$, and resistors $R_{18}$ and $R_{20}$.

Figure 6B:
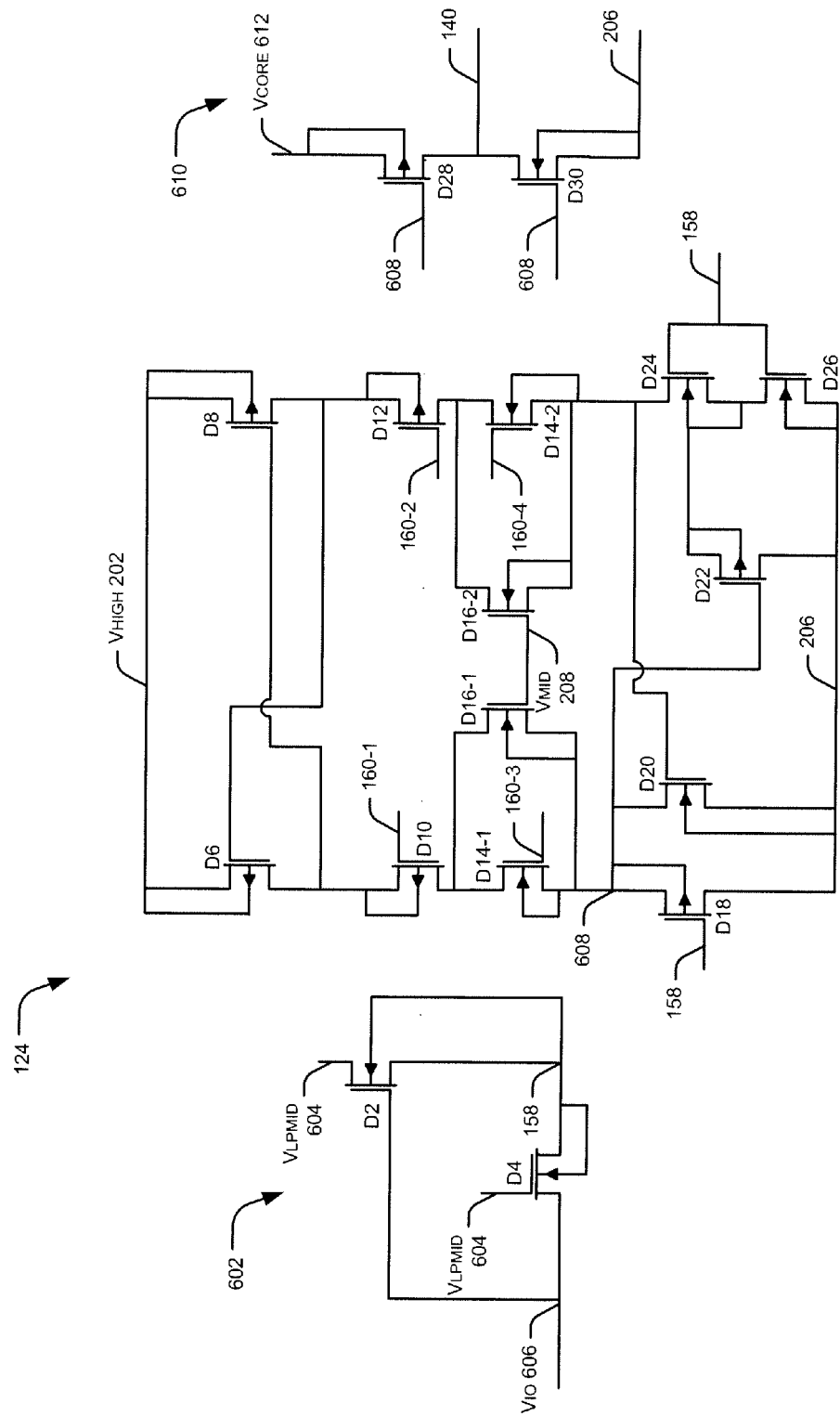
FIG. 6(b) illustrates exemplary schematic diagram of a receiver, in accordance with an embodiment of the present subject matter.

In said embodiment, the IO signal 156 from the IO pad 106 is conditioned to generate the conditioned IO signal 158. For example, the conditioned IO signal 158 is slew controlled and has a lower swing than that of the IO signal 156. Such a conditioned IO signal is fed to a pad conditioning block circuit 602, as shown in FIG. 6(b). In one embodiment, the pad conditioning block 602 includes two n-channel transistors, $D_2$ and $D_4$, as shown in FIG. 6(b). A low pass filtered $V_{MID}$ voltage supply, or $V_{LPMID}$ 604, is applied at a gate terminal of the transistor $D_4$ and at a source terminal of the transistor $D_2$ to yield the conditioned IO signal 158 at an output of the reference bias generator circuit 602. The conditioned IO signal 158 is greater of the two voltages, $V_{LPMID}$ 604 and $V_{IO}$ 606, where $V_{IO}$ 606 is the voltage of the IO signal 156.

Referring back to FIG. 6(a), the conditioned IO signal 158 is applied at gate terminals of the transistors $S_{14}$, $S_{16}$, $S_{30}$, and $S_{36}$. In this design, the characteristic property of the n-channel and p-channel transistors being complementary of each other is utilized. When conditioned IO signal 158 is applied, two pairs of complementary and differential reference signals at two common mode levels, similar to the ones generated by the dynamic driver reference generator 116, are generated.

For example, the dynamic receiver reference signals RML 160-1 and RMR 160-2 (complement of RML 160-1) at a common mode level CM1, and the dynamic receiver reference signals RPL 160-3 and RPR 160-4 (complement of RPL 160-3) at a common mode level CM2 are obtained at nodes shown in the figure. The dynamic receiver reference signals are hereinafter collectively represented as dynamic receiver reference signals 160 and are connected to the receiver 124. Further, the dynamic receiver reference signals 160 are synchronized with the conditioned IO signal 158. Similar to the dynamic driver reference generator 116, the dynamic receiver reference generator 122 can also operate in various modes, such as the zero current consumption mode. To this end, mode selection signals 204 are applied as gating signals to the transistors $S_2$, $S_4$, $S_{20}$ and $S_{22}$.

As shown in FIG. 6(b), the receiver 124 includes a circuit with transistors $D_2$ to $D_{30}$. The dynamic receiver reference signals 160 are applied at the gates of $D_{10}$, $D_{12}$, $D_{14-1}$, and $D_{16-1}$. In one embodiment, $D_{10}$ and $D_{12}$ receive RML 160-1 and RMR 160-2 at their respective gates, while $D_{14-1}$ and $D_{16-1}$ receive RPL 160-3 and RPR 160-4 at their respective gates. An output of the receiver OUTR 608 is fed to an inverter stage 610, which provides the core signal 140 to the core 104. Based on the OUTR 608, the core signal 140 switches between a core voltage $V_{CORE}$ 612 or the ground 206. The input to the receiver 124 is limited between the ground 206 and the $V_{MID}$ 208. The operation of the receiver 124 is similar to the operation of the level shifter 118 as discussed in FIG. 3.

Figure 7:
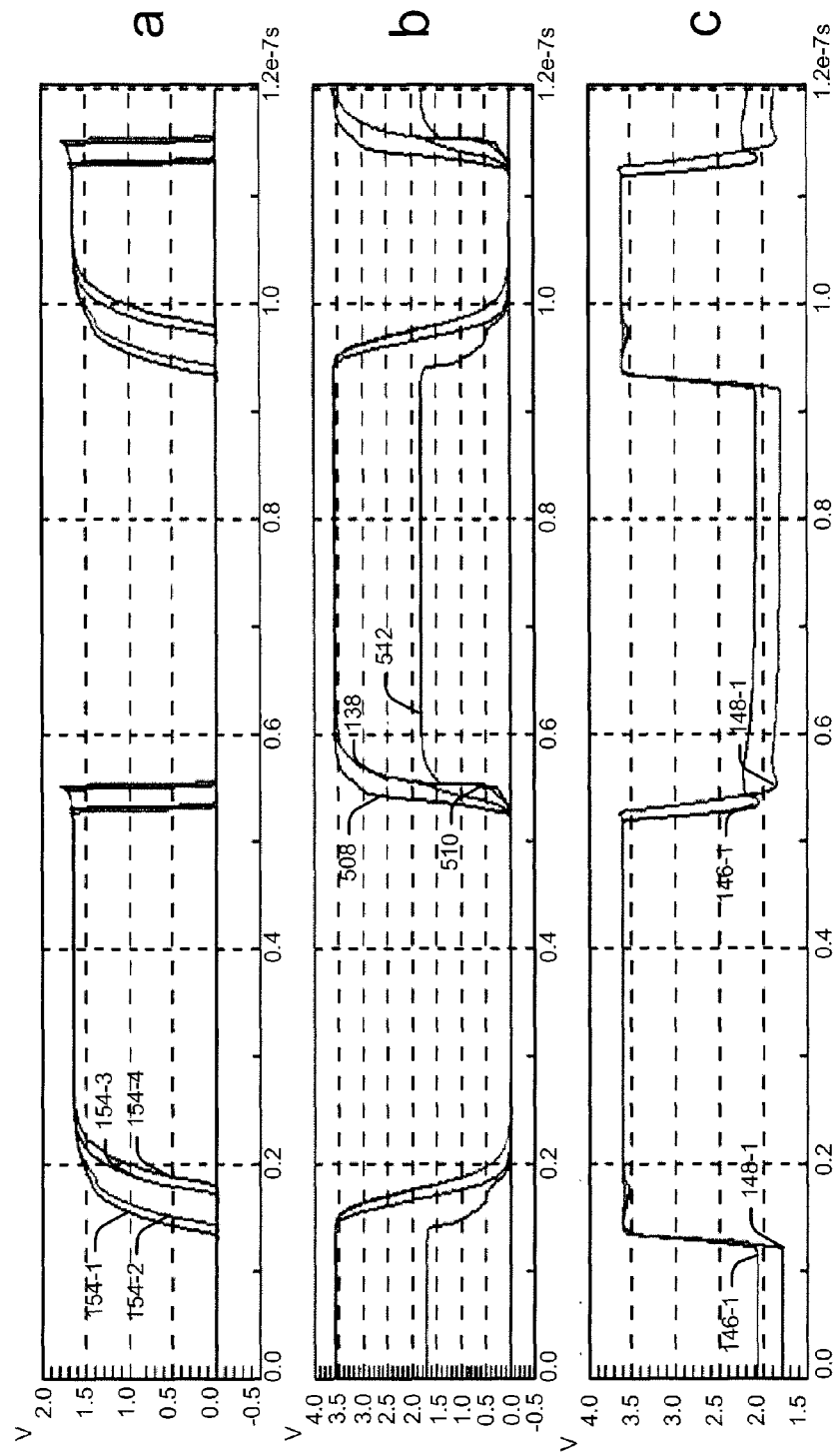
FIGS. 7 and 8 are plots depicting various signals applied to and obtained from the driver implemented in the exemplary system.

FIG. 7(a) is a plot depicting the skewed signals ND 154. As shown, the skewed signals ND 154 are skewed in time so as to set an optimum impedance for the driver 112. This helps in avoiding stress in transient simulations, thus helping in controlled discharging and charging of the IO pad 104. In the illustration, the skewed signals ND 154 are successively skewed from each other by 600 picoseconds (ps) with an accuracy of (+/-) 180 ps. This is further illustrated in the diagrams as all the four signals are roughly skewed by the same figure.

FIG. 7(b) shows plots for the various signals obtained at the driver 112, for example, the pad signal 136 and the signals obtained at the OUTN 510, the OUTP 508, the DRN 512. As evident from the plots, the voltage at the DRN 512 is below 1.5V, thus avoiding stress at the transistor $T_{30}$ of the driver 112.

FIG. 7(c) illustrates the difference between the level shifted signal PL 146-1 and the pre-driver signal PLL 148-1. Both the signals are in phase but skewed or delayed in time as both are derived from two different stages.

Figure 8:
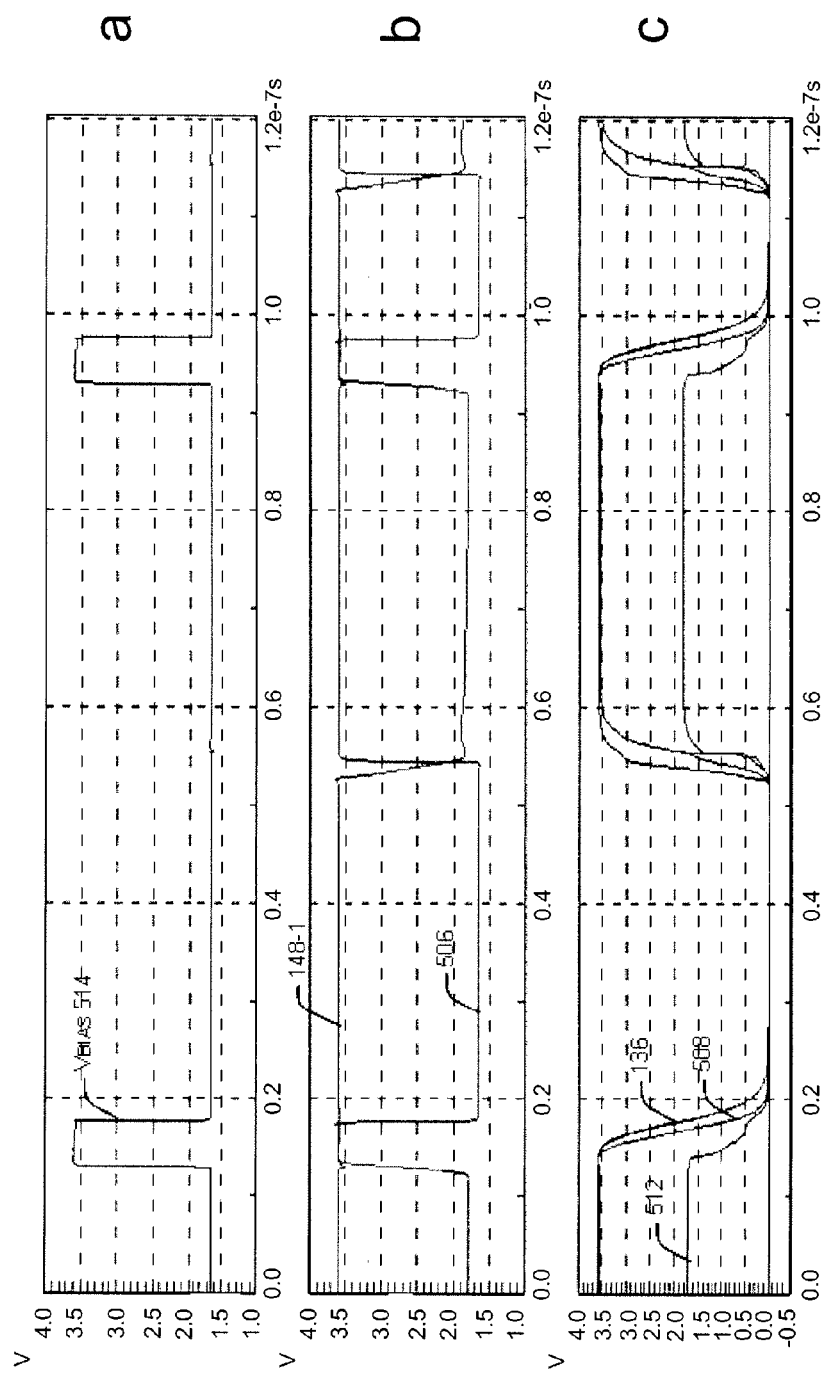

FIGS. 8(a), (b), and (c) show that by a logical AND of the DRPE 506 and the PLL 148-1, a short pulse is obtained having the output $V_{BIAS}$ 514. Also, it should be noted that the short pulse is obtained at a negative transition of the pad signal 136. By identifying the transition and generating short pulses, the dynamically adjusted bias controls the charging and discharging of the stress transistor $T_{30}$.

Figure 9:
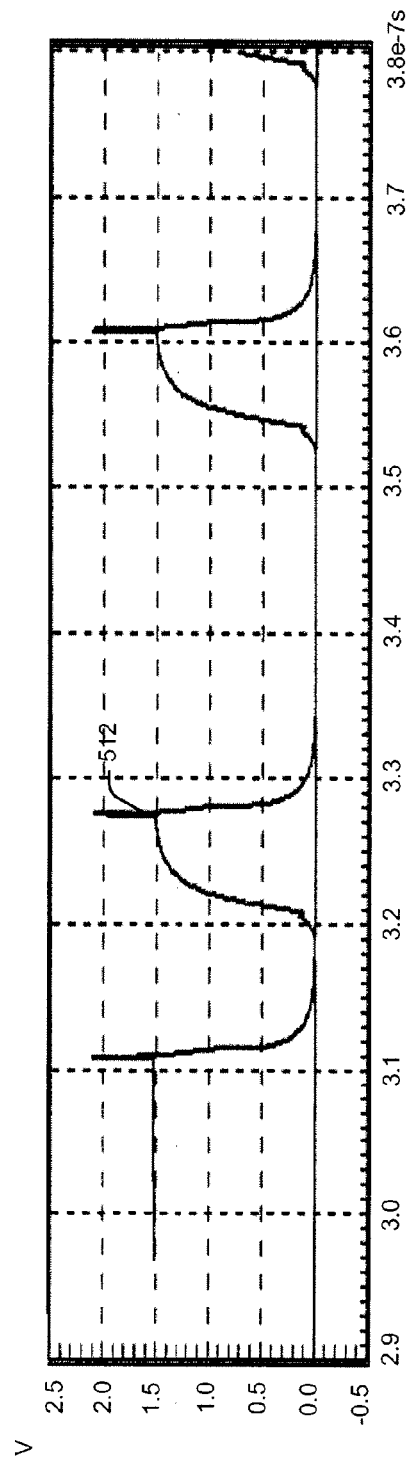
FIG. 9 depicts the level of stress reduced on transistors in the exemplary driver, in accordance with an embodiment of the present subject matter.

FIG. 9 depicts the level of stress on transistor $T_{30}$. Clearly, the drain to source stress is less than about 2.1 volts as seen in the transients.

Figure 10:
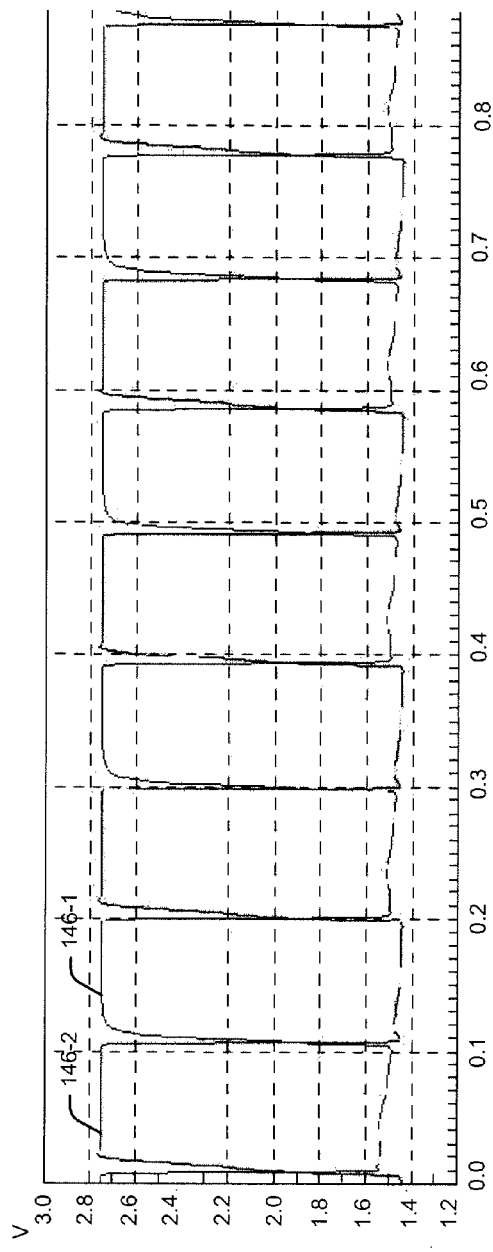
FIG. 10(a) depicts level shifted signals derived from the level shifter, in accordance with an embodiment of the present subject matter.
FIG. 10(b) illustrates dynamic driver reference signals derived from the dynamic driver reference generator, in accordance with an embodiment of the present subject matter.
Figure 10:
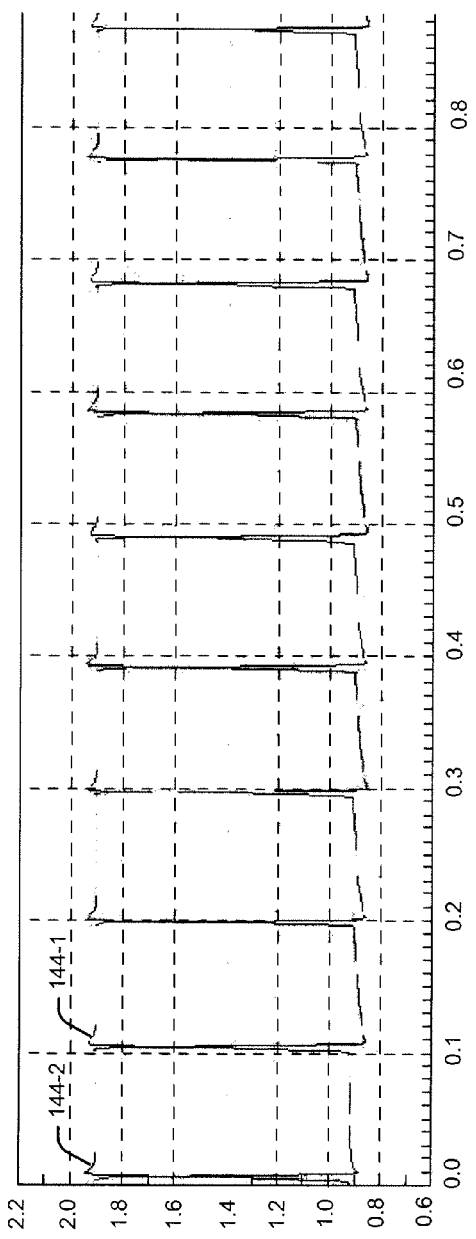

FIG. 10(a) is a plot depicting the level shifted signals PL 146-1 and PR 146-2, while FIG. 10(b) illustrates the and the dynamic driver reference signals MIDML 144-1 and MIDMR 144-2. The IO buffer 102 described herein is capable of providing a wide range drive solution at a frequency of about 100 MHz with optimized area and power consumption. Additionally, thin oxide transistors having thickness in the order of 28 Å can be implemented, thus reducing the number of fabrication steps, the overall PCB real estate, and the cost. In addition, the transistors are not stressed even at higher speeds because of the dynamically generated reference signals 144, which are based on the conditioned data signals 142 from the core 104 and the IO buffer supply voltage $V_{HIGH}$ 202. Hence, a continuous range of operation for the voltage supply range of 1.6 V to 3.6 V is obtained by satisfying both the drive and dynamic specifications in this range. It will be appreciated that a single external reference rail for IO buffer supply voltage $V_{HIGH}$ 202 is used in the implementations described herein as $V_{MID}$ 208 may be derived from the IO buffer supply voltage $V_{HIGH}$ 202. Also, the present configuration helps to operate at a $V_{CORE}$ as low as 0.65V. It should also be noted that the $V_{MID}$ 208 is not required in the low power mode as the IO buffer supply voltage $V_{HIGH}$ 202 itself drops to 1.6V.

Although embodiments for input and output buffer have been described in language specific to structural features and/or methods, it is to be understood that the invention is not necessarily limited to the specific features or methods described. Rather, the specific features and methods are disclosed as exemplary embodiments for the input and output buffer.

I claim:

1. A system comprising:
   a dynamic driver reference generator to generate a plurality of dynamic driver reference signals based on a data signal and an input and output (IO) buffer supply voltage;
   a level shifter to generate a plurality of level shifted signals based in part on the dynamic driver reference signals; and
   a driver having at least one stress transistor, wherein the driver is configured to dynamically adjust a voltage across the stress transistor based at least on one of the dynamic driver reference signals, the level shifted signals, and a current state of an IO pad,
   wherein the dynamic driver reference signals comprise a first dynamic driver reference signal, a second dynamic driver reference signal, a third dynamic driver reference signal, and a fourth dynamic driver reference signal, wherein the first dynamic driver reference signal is a complement of the second dynamic driver reference signal, and the third dynamic driver reference signal is a complement of the fourth dynamic driver reference signal.

2. The system as claimed in claim 1, wherein the data signal comprises transients.

3. The system as claimed in claim 1 further comprising a core to generate the data signal and at least one control signal.

4. The system as claimed in claim 3, wherein the system is configured to select a mode of operation based on the control signal, and wherein the mode of operation comprises at least one of a normal mode, a zero current consumption mode, a low power supply mode, a low power consumption mode, a transmit mode, and a receive mode.

5. The system as claimed in claim 1 comprising a control logic unit to generate a conditioned data signal and a complement of the conditioned data signal, based at least on the data signal.

6. The system as claimed in claim 5, wherein the level shifter further comprises:
   a first transistor configured to receive the conditioned data signal;
   a second transistor configured to receive the complement of the conditioned data signal; and
   a plurality of cascode transistors, wherein each of the cascode transistors is configured to receive a dynamic driver reference signal based on the conditioned data signal, the complement of the conditioned data signal, and the IO buffer supply voltage.

7. The system as claimed in claim 6, wherein the first transistor, the second transistor, and the cascode transistors are thin-oxide transistors each having a gate oxide thickness of about 28 Angstroms.

8. The system as claimed in claim 5, wherein the dynamic driver reference generator comprises a first variable current source and a second variable current source, wherein the first variable current source is controlled by the conditioned data signal and the second variable current source is controlled by the complement of the conditioned data signal.

9. The system as claimed in claim 1, wherein the first and the second dynamic driver reference signals are at a first common mode level, and the third and the fourth dynamic driver reference signals are at a second common mode level.

10. The system as claimed in claim 1 further comprising:
    a pre-driver to provide a plurality of pre-driver signals based on the level shifted signals and the dynamic driver reference signals; and
    a skew circuit to generate one or more skewed signals based on the pre-driver signals.

11. The system as claimed in claim 10, wherein the driver is coupled to the pre-driver and the skew circuit.

12. The system as claimed in claim 10 further comprises a pad detection and logic circuit coupled to the driver, wherein the pad detection and logic circuit is configured to identify, based at least on the pre-driver signals and the skewed signals, at least one control signal triggering a transition in the IO pad.

13. The system as claimed in claim 1, wherein the driver further comprises a dynamic bias circuit configured to supply a dynamic bias signal to the stress transistor in response to at least one control signal triggering a transition in the IO pad.

14. The system as claimed in claim 13, wherein the dynamic bias circuit further comprises:
    an n bias unit having a NAND circuit, inputs of the n-bias unit are a pre-driver signal and an inverted signal; and
    a p-bias unit having a NOR circuit, inputs of the p-bias unit are a skewed signal and another inverted signal.

15. The system as claimed in claim 1, wherein the driver further comprises a bulk comparison circuit to provide a voltage greater between the IO buffer supply voltage and a pad voltage.

16. The system as claimed in claim 1 further comprises:
    a dynamic receiver reference generator to generate a plurality of dynamic receiver reference signals; and
    a receiver having at least one stress transistor, wherein the receiver is configured to dynamically adjust a voltage across the stress transistor based on at least one of the IO buffer supply voltage, an IO signal, and dynamic receiver reference signals.

17. The system as claimed in claim 16, wherein the receiver and the driver are coupled to the IO pad.

18. The system as claimed in claim 16, wherein the dynamic receiver reference signals comprise a first dynamic receiver reference signal, a second dynamic receiver reference signal, a third dynamic receiver reference signal, and a fourth dynamic receiver reference signal, wherein the first receiver reference signal is a complement of the second receiver reference signal, and the third receiver reference signal is a complement of the fourth receiver reference signal.

19. The system as claimed in claim 18, wherein the first and the second receiver reference signals are at a first common mode level, and the third and the fourth receiver reference signals are at a second common mode level.

20. A driver comprising:
    at least one stress transistor;
    at least one cascode transistor; and
    a dynamic bias circuit configured to supply a dynamic bias signal to the cascode transistor such that a stress voltage across the stress transistor is within a pre-determined value,
    wherein the driver is configured to dynamically adjust the stress voltage based at least on one of a plurality of dynamic driver reference signals, and
    wherein the dynamic driver reference signals comprise a first dynamic driver reference signal, a second dynamic driver reference signal, a third dynamic driver reference signal, and a fourth dynamic driver reference signal, wherein the first dynamic driver reference signal is a complement of the second dynamic driver reference signal, and the third dynamic driver reference signal is a complement of the fourth dynamic driver reference signal.

21. The driver as claimed in claim 20, wherein the driver is coupled to a skew circuit, and wherein the driver comprises a set of transistors configured to receive corresponding skewed signals from the skew circuit.

22. The driver as claimed in claim 20, wherein the driver is coupled to a pre-driver circuit, and wherein the driver comprises another set of transistors to receive the pre-driver signals from the pre-driver circuit.

23. The driver as claimed in claim 20, wherein the driver is coupled to a level shifter, and wherein the driver comprises at least one transistor to receive at least one of the level shifted signals from the level shifter.

24. The driver as claimed in claim 20 further comprising one or more inverter stages to generate an inverted signal indicating a current state of an input and output (IO) pad, wherein the dynamic bias signal is generated based on the inverted signal.

25. The driver as claimed in claim 20 further comprising a bulk comparison circuit to provide a voltage greater between an IO buffer supply voltage and a pad voltage.

26. The driver as claimed in claim 20, wherein the dynamic bias circuit further comprises an n-bias unit and a p-bias unit, and an output of the dynamic bias circuit is the dynamic bias signal.

27. The driver as claimed in claim 20, wherein the stress transistor and the cascode transistor are thin-oxide transistors each having a gate oxide thickness of about 28 Angstroms.

28. A level shifter comprising:
    a first transistor configured to receive a conditioned data signal;

a second transistor configured to receive a complement of the conditioned data signal;

a plurality of cascode transistors, each of the cascode transistors is configured to receive a dynamic driver reference signal based on the conditioned data signal and the complement of the conditioned data signal, wherein the first transistor, the second transistor, and the cascode transistors are thin-oxide transistors each having a gate oxide thickness of about 28 Angstroms.

29. The level shifter as claimed in claim 28, wherein the level shifter is configured to operate in a low current consumption mode and a normal mode.

30. A method comprising:

providing at least a plurality of dynamic driver reference signals, level shifted signals, and pre-driver signals in response to variations in a data signal and an input and output (IO) buffer supply voltage; and providing a dynamic bias signal to a stress transistor, the dynamic bias signal is based at least on a pad signal, the dynamic driver reference signals, the level shifted signals and the pre-driver signals, wherein the dynamic driver reference signals comprise a first dynamic driver reference signal, a second dynamic driver reference signal, a third dynamic driver reference signal, and a fourth dynamic driver reference signal, wherein the first dynamic driver reference signal is a complement of the second dynamic driver reference signal, and the third dynamic driver reference signal is a complement of the fourth dynamic driver reference signal.

31. The method as claimed in claim 30 further comprising:

receiving the data signal and conditioning the data signal to provide a plurality of conditioned data signals;

generating the plurality of dynamic driver reference signals based on the conditioned data signal and the IO buffer supply voltage;

generating a plurality of level shifted signals based on the conditioned data signal and the dynamic driver reference signals; and generating a plurality of pre-driver signals based on the level shifted signals.

32. The method as claimed in claim 30 further comprising identifying at least one control signal triggering a transition in the IO pad.

33. The method as claimed in claim 30 further comprising varying a gate voltage of the stress transistor such that a gate-to-source voltage across the stress transistor is constant.

\* \* \* \* \*

UNITED STATES PATENT AND TRADEMARK OFFICE
CERTIFICATE OF CORRECTION

| | |
|---|---|
| PATENT NO. | : 8,044,684 B1 |
| APPLICATION NO. | : 12/840934 |
| DATED | : October 25, 2011 |
| INVENTOR(S) | : Sushrant Monga |

It is certified that error appears in the above-identified patent and that said Letters Patent is hereby corrected as shown below:

Column 9, line 20, "$R_4$" should be --$R_8$--

Signed and Sealed this
Thirteenth Day of March, 2012

David J. Kappos
*Director of the United States Patent and Trademark Office*